(12) United States Patent
Cohen et al.

(10) Patent No.: US 7,640,651 B2
(45) Date of Patent: Jan. 5, 2010

(54) FABRICATION PROCESS FOR CO-FABRICATING MULTILAYER PROBE ARRAY AND A SPACE TRANSFORMER

(75) Inventors: Adam L. Cohen, Los Angeles, CA (US); Vacit Arat, La Canada Flintridge, CA (US); Michael S. Lockard, Lake Elizabeth, CA (US); Christopher A. Bang, San Diego, CA (US); Pavel B. Lembrikov, Santa Monica, CA (US)

(73) Assignee: Microfabrica Inc., Van Nuys, CA (US)

( * ) Notice: Subject to any disclaimer, the term of this patent is extended or adjusted under 35 U.S.C. 154(b) by 888 days.

(21) Appl. No.: 11/028,945

(22) Filed: Jan. 3, 2005

(65) Prior Publication Data
US 2005/0223543 A1    Oct. 13, 2005

Related U.S. Application Data

(60) Provisional application No. 60/533,948, filed on Dec. 31, 2003, provisional application No. 60/574,737, filed on May 26, 2004.

(51) Int. Cl.
*H01F 3/04*   (2006.01)
*H01F 7/06*   (2006.01)

(52) U.S. Cl. .................. 29/609; 29/592.1; 29/602.1; 324/754; 324/761; 324/762; 369/112.01; 369/112.05; 369/112.06; 369/112.09; 438/254; 438/381; 438/622

(58) Field of Classification Search ............... 29/592.1, 29/602.1, 609; 324/754, 761, 762; 369/112.01, 369/112.05, 112.06, 112.09, 112.27; 438/254, 438/381, 622
See application file for complete search history.

(56) References Cited

U.S. PATENT DOCUMENTS

| | | | | |
|---|---|---|---|---|
| 3,832,632 | A | 8/1974 | Ardezzone | 324/756 |
| 4,961,052 | A | 10/1990 | Tada et al. | 324/158 |
| 5,020,219 | A | 6/1991 | Leedy | 29/846 |
| 5,070,297 | A | 12/1991 | Kwon et al. | 324/158 |
| 5,190,637 | A | 3/1993 | Guckel | 205/118 |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, p. 161.

(Continued)

*Primary Examiner*—Paul D Kim
(74) *Attorney, Agent, or Firm*—Dennis R. Smalley

(57) ABSTRACT

Embodiments of the invention provide fabrication processes for the co-fabrication of microprobe arrays along with one or more space transformers wherein the fabrication processes include the forming and adhering of a plurality of layers to previously formed layers and wherein at least a portion of the plurality of layers are formed from at least one structural material and at least one sacrificial material that is at least in part released from the plurality of layers after formation and wherein the space transformer includes a plurality of interconnect elements that connect one side to the array of probes that has a first spacing to another side that has a second spacing where the second spacing is greater than the first spacing. In some embodiments, the fabrication process includes a plurality of electrodeposition operations.

4 Claims, 30 Drawing Sheets

U.S. PATENT DOCUMENTS

| | | | |
|---|---|---|---|
| 5,772,451 A | 6/1998 | Dozier et al. | 439/70 |
| 5,806,181 A | 9/1998 | Khandros et al. | 29/874 |
| 5,820,014 A | 10/1998 | Dozier et al. | 228/56.3 |
| 5,829,128 A | 11/1998 | Eldridge et al. | 29/855 |
| 5,917,707 A | 6/1999 | Khandros et al. | 361/776 |
| 5,974,662 A | 11/1999 | Eldridge et al. | 29/842 |
| 5,994,152 A | 11/1999 | Eldridge et al. | 29/842 |
| 6,023,103 A | 2/2000 | Chang et al. | 257/781 |
| 6,027,630 A | 2/2000 | Cohen | 205/135 |
| 6,043,563 A | 3/2000 | Eldridge et al. | 257/784 |
| 6,044,548 A | 4/2000 | Distefano et al. | 29/840 |
| 6,051,875 A * | 4/2000 | Dando | 257/632 |
| 6,064,213 A | 5/2000 | Khandros et al. | 324/754 |
| 6,074,896 A * | 6/2000 | Dando | 438/114 |
| 6,208,225 B1 | 3/2001 | Miller | 333/202 |
| 6,218,910 B1 | 4/2001 | Miller | 333/33 |
| 6,441,315 B1 | 8/2002 | Eldridge et al. | 174/260 |
| 6,456,099 B1 | 9/2002 | Eldridge et al. | 324/754 |
| 6,482,013 B2 | 11/2002 | Eldridge et al. | 439/66 |
| 6,483,328 B1 | 11/2002 | Eldridge et al. | 324/754 |
| 6,499,216 B1 | 12/2002 | Fjelstad | 29/842 |
| 6,509,751 B1 | 1/2003 | Mathieu et al. | 324/754 |
| 6,520,778 B1 | 2/2003 | Eldridge et al. | 439/66 |
| 6,539,531 B2 | 3/2003 | Miller et al. | 716/15 |
| 6,627,483 B2 | 9/2003 | Ondricek et al. | 438/117 |
| 6,640,415 B2 | 11/2003 | Eslamy et al. | 29/593 |
| 6,672,875 B1 | 1/2004 | Mathieu et al. | 439/66 |
| 6,690,185 B1 | 2/2004 | Khandros et al. | 324/758 |
| 6,690,186 B2 | 2/2004 | Fjelstad | 324/762 |
| 6,705,876 B2 | 3/2004 | Eldridge | 439/66 |
| 6,713,374 B2 | 3/2004 | Eldridge et al. | 438/611 |
| 6,729,019 B2 | 5/2004 | Grube et al. | 29/830 |
| 6,778,742 B2 * | 8/2004 | Brown et al. | 385/100 |
| 6,817,052 B2 | 11/2004 | Grube | 15/3 |
| 6,838,893 B2 | 1/2005 | Khandros, Jr. et al. | 324/754 |
| 6,913,468 B2 | 7/2005 | Dozier, II et al. | 439/66 |
| 7,142,000 B2 | 11/2006 | Eldridge et al. | 324/765 |
| 2003/0186405 A1 | 10/2003 | Lee et al. | 435/182 |
| 2004/0007470 A1 | 1/2004 | Smalley | 205/118 |
| 2004/0072452 A1 | 4/2004 | Eldridge et al. | 439/69 |
| 2005/0029225 A1 | 2/2005 | Zhang | 216/40 |
| 2005/0045585 A1 | 3/2005 | Zhang et al. | 216/58 |
| 2005/0142846 A1 | 6/2005 | Frodis et al. | 438/622 |
| 2005/0148214 A1 | 7/2005 | Mathieu et al. | 439/67 |
| 2005/0179458 A1 | 8/2005 | Chen et al. | 324/762 |
| 2005/0184748 A1 | 8/2005 | Chen et al. | 324/761 |
| 2006/0006888 A1 | 1/2006 | Kruglick et al. | 324/754 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 1999, p. 244.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd. International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFAB™)", Chapter 19 of the MEMS Handbook, edited by Mohamed Gad-El-Hak, CRC Press, 2002, pp. 19/1-19/23.

* cited by examiner

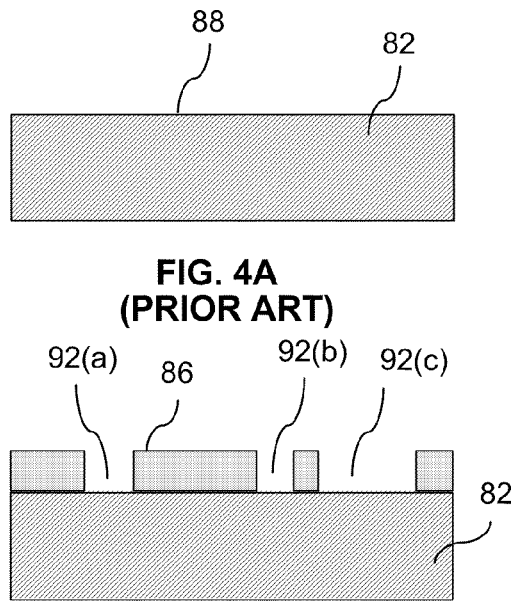
FIG. 4A (PRIOR ART)
FIG. 4B (PRIOR ART)
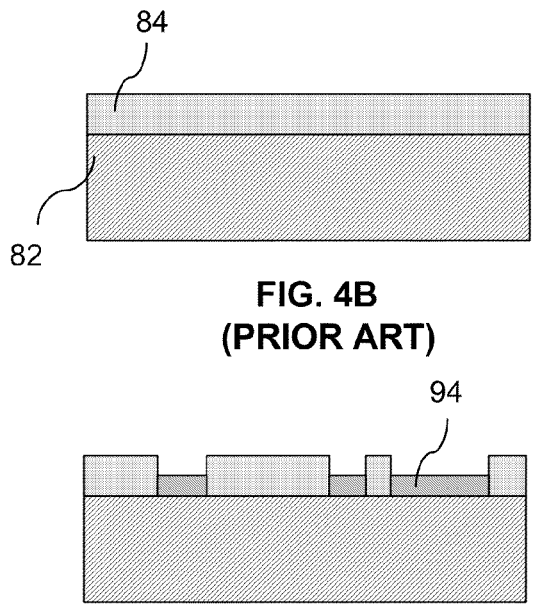
FIG. 4C (PRIOR ART)
FIG. 4D (PRIOR ART)
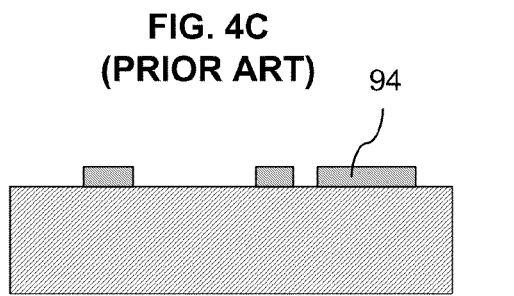
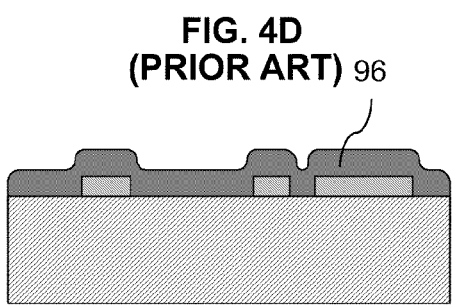
FIG. 4E (PRIOR ART)
FIG. 4F (PRIOR ART)
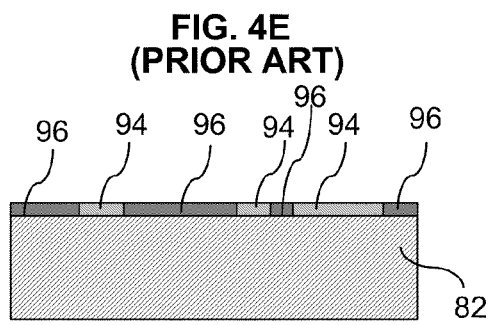
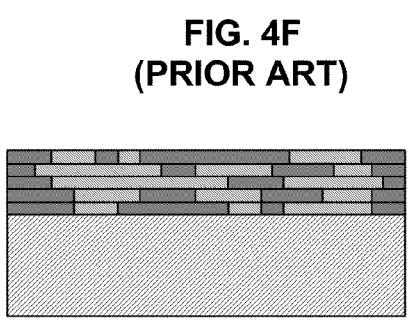
FIG. 4G (PRIOR ART)
FIG. 4H (PRIOR ART)
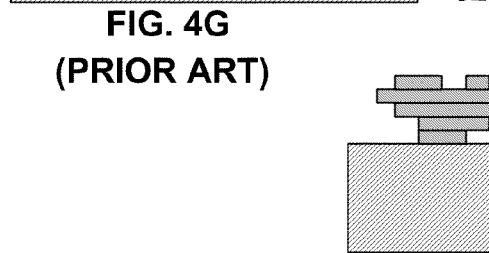
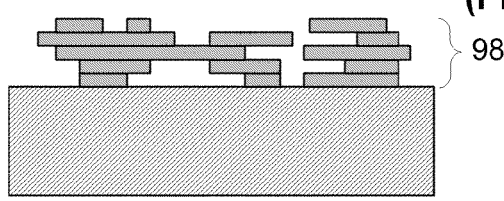
FIG. 4I (PRIOR ART)

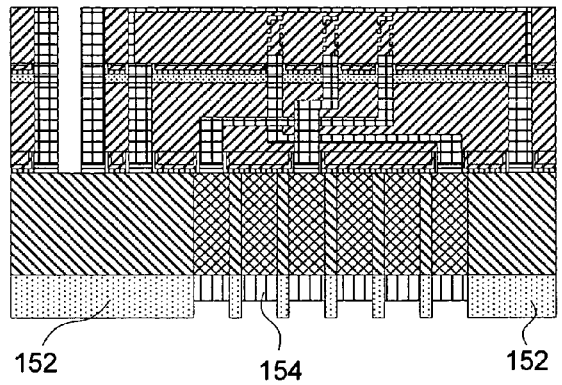
152  154  152
FIG. 13Q
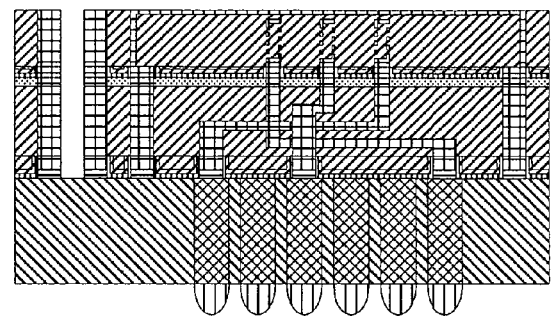
FIG. 13R
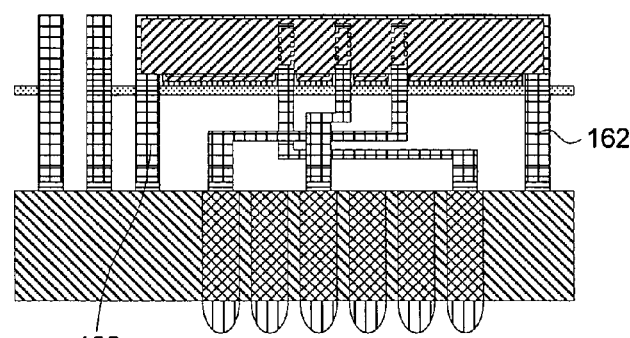
162  FIG. 13S
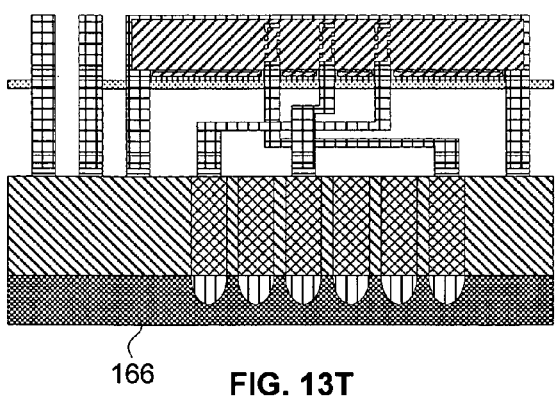
166  FIG. 13T

FABRICATION PROCESS FOR CO-FABRICATING MULTILAYER PROBE ARRAY AND A SPACE TRANSFORMER

RELATED APPLICATIONS

This application claims benefit of U.S. Provisional Patent Application Nos. 60/533,948 and 60/574,737, filed Dec. 31, 2003 and May 26, 2004, respectively. These applications are hereby incorporated herein by reference as if set forth in full herein.

FIELD OF THE INVENTION

The present invention relates generally to the field of electrochemical fabrication and the associated formation of three-dimensional structures (e.g. microscale or mesoscale structures). In particular, it relates to electrochemical fabrication methods for fabricating space transformers and microprobes.

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen Corporation) of Van Nuys, Calif. under the name EFAB®. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen Corporation) of Van Nuys, Calif. such masks have come to be known as INSTANT MASKS™ and the process known as INSTANT MASKING™ or INSTANT MASKING™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING™) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

(1) Selectively depositing at least one material by electrodeposition upon one or more desired regions of a substrate.

(2) Then, blanket depositing at least one additional material by electrodeposition so that the additional deposit covers both the regions that were previously selectively deposited onto, and the regions of the substrate that did not receive any previously applied selective depositions.

(3) Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C.

The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Even though electrochemical fabrication as taught and practiced to date, has greatly enhanced the capabilities of microfabrication, and in particular added greatly to the number of metal layers that can be incorporated into a structure and to the speed and simplicity in which such structures can be made, room for enhancing the state of electrochemical fabrication exists as well as for adding to the types of devices that can be formed or co-fabricated with other devices.

SUMMARY OF THE INVENTION

It is an object of some embodiments of the invention to provide a process for forming space transformers using electrochemical fabrication methods.

It is an object of some embodiments of the invention to provide a process for forming space transformers and microprobes in the same build process Other objects and advantages of various embodiments of the invention will be apparent to those of skill in the art upon review of the teachings herein. The various embodiments of the invention, set forth explicitly herein or otherwise ascertained from the teachings herein, may address one or more objects alone or in combination, or alternatively may address some other object of the invention ascertained from the teachings herein. It is not necessarily intended that all objects be addressed by any single aspect of the invention even though that may be the case with regard to some aspects.

In a first aspect of the invention, a fabrication process for co-fabricating a multi-layer probe array and a space transformer, includes: (a) forming and adhering a layer of material to a previously formed layer and/or to a substrate, wherein the layer comprises a desired pattern of at least one material; and (b) repeating the forming and adhering operation of (a) a plurality of times to build up an array of probes and a space transformer from a plurality of adhered layers, and wherein at least a portion of the plurality of layers comprises at least one structural material and at least one sacrificial material; and (c) after formation of at least a plurality of layers, subjecting the multi-layer structure to a release process that removes at least a portion of at least one sacrificial material from at least some portions of some layers, wherein the space transformer comprise a plurality of interconnect elements that connect on one side to probes that have a first averaged spacing and connect to pads on another side that have a second averaged spacing that is greater than the first averaged spacing.

In a second aspect of the invention, a fabrication process for fabricating a multi-layer space transformer, comprises: (a) forming and adhering a layer of material to a previously formed layer and/or to a substrate, wherein the layer comprises a desired pattern of at least one material; and (b) repeating the forming and adhering operation of (a) a plurality of times to build up configuration of conductive interconnect elements in a configuration of a desired space transformer, wherein the plurality of layers are adhered to one another and comprise at least one of (i) at least one structural material and at least one sacrificial material or (ii) at least two structural materials one of which is a conductor and one of which is a dielectric.

In a specific variation of the second aspect of the invention the space transformer includes metal electrodeposited or electroless deposited on a layer by layer basis where the height of at least some layers is set by a planarization operation that planarizes an interconnect material and at least one other material.

In a specific variation of the second aspect of the invention the space transformer includes vias and traces that coexist on at least some layers.

In a specific variation of the second aspect of the invention the space transformer includes at least one more coaxial interconnects.

In a specific variation of the second aspect of the invention the space transformer includes interconnects having traces having at least two different widths.

In a specific variation of the second aspect of the invention the space transformer includes interconnects comprising vias that have at least two different widths.

In a specific variation of the second aspect of the invention the space transformer includes interconnects have trace thicknesses that are at least as thick as some planarized thicknesses of a dielectric material.

In a specific variation of the second aspect of the invention the space transformer includes interconnects have trace thicknesses that are at least as thick as the differential height between some interconnect traces.

In a specific variation of the second aspect of the invention at least one layer of the space transformer is formed using a process comprising: patterning a first material, applying a non-planar seed layer, electrodepositing a second material, and trimming off at least a portion of the deposited first material.

In a third aspect of the invention, a space transformer includes a plurality of interconnect elements that are connectable on one side to probes that have a first averaged spacing and connectable on a different side to pads that have a second averaged spacing that is greater than the first averaged spacing.

In a specific variation of the third aspect of the invention the space transformer includes metal electrodeposited or electroless deposited on a layer by layer basis where the height of at least some layers is set by a planarization operation that planarizes an interconnect material and at least one other material.

In a specific variation of the third aspect of the invention the space transformer includes vias and traces that coexist on at least some layers.

In a specific variation of the third aspect of the invention the space transformer includes at least one more coaxial interconnects.

In a specific variation of the third aspect of the invention the space transformer includes interconnects having traces having at least two different widths.

In a specific variation of the third aspect of the invention the space transformer includes interconnects comprising vias that have at least two different widths.

In a specific variation of the third aspect of the invention the space transformer includes interconnects have trace thicknesses that are at least as thick as some planarized thicknesses of a dielectric material.

In a specific variation of the third aspect of the invention the space transformer includes interconnects have trace thicknesses that are at least as thick as the differential height between some interconnect traces.

Further aspects of the invention will be understood by those of skill in the art upon reviewing the teachings herein. Other aspects of the invention may involve apparatus that can be used in implementing one or more of the above method aspects of the invention. These other aspects of the invention may provide various combinations of the aspects, embodiments, and associated alternatives explicitly set forth herein as well as provide other configurations, structures, functional relationships, and processes that have not been specifically set forth above.

BRIEF DESCRIPTION OF THE DRAWINGS

FIGS. 4A-4I schematically depict the formation of a first layer of a structure using adhered mask plating where the blanket deposition of a second material overlays both the openings between deposition locations of a first material and the first material itself.

DETAILED DESCRIPTION OF PREFERRED EMBODIMENTS OF THE INVENTION

Figure 1A:
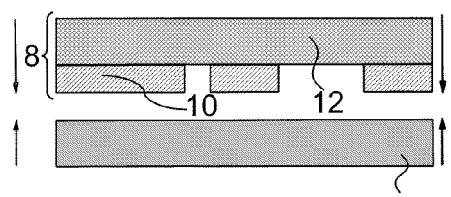
FIGS. 1A-1C schematically depict side views of various stages of a CC mask plating process, while FIGS. 1D-G schematically depict a side views of various stages of a CC mask plating process using a different type of CC mask.
Figure 1B:
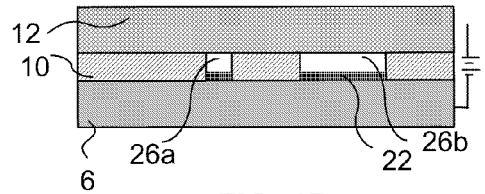
Figure 1C:
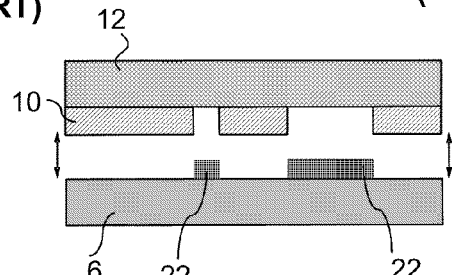
Figure 1D:
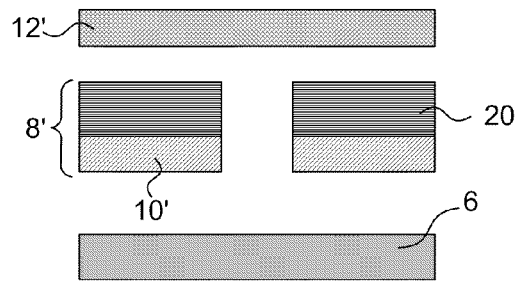
Figure 1E:
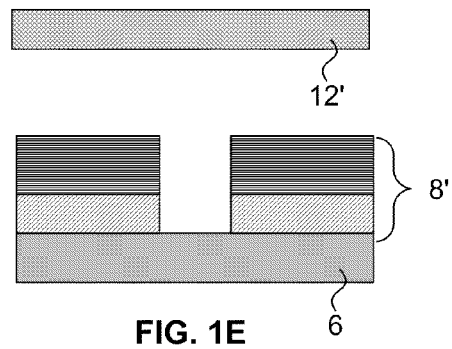
Figure 1F:
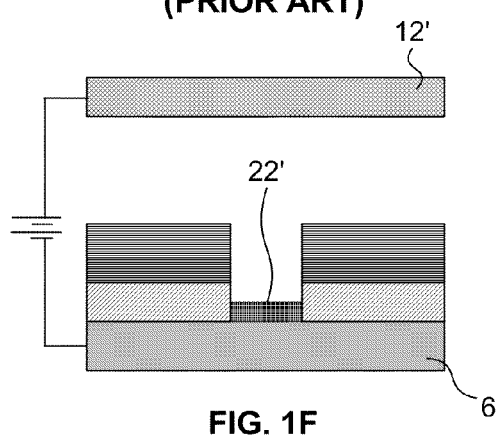
Figure 1G:
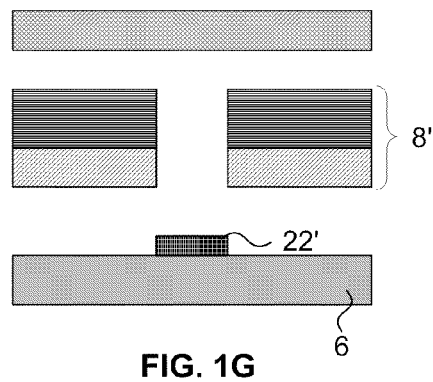
Figure 2A:
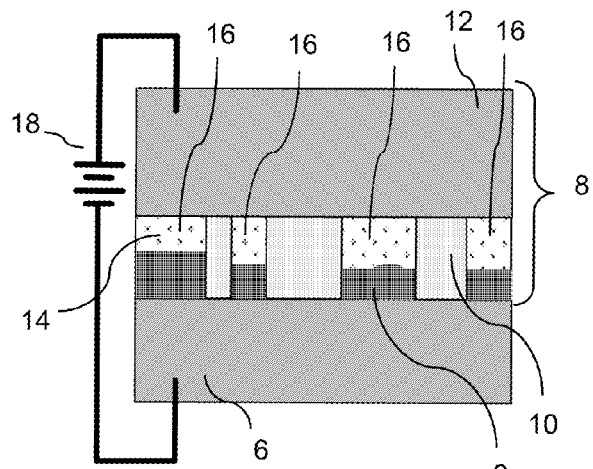
FIGS. 2A-2F schematically depict side views of various stages of an electrochemical fabrication process as applied to the formation of a particular structure where a sacrificial material is selectively deposited while a structural material is blanket deposited.
Figure 2B:
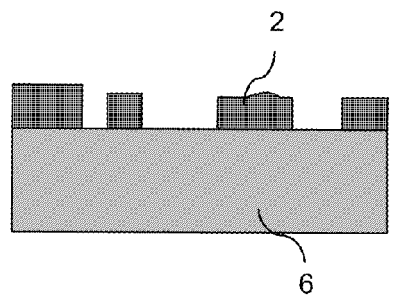
Figure 2C:
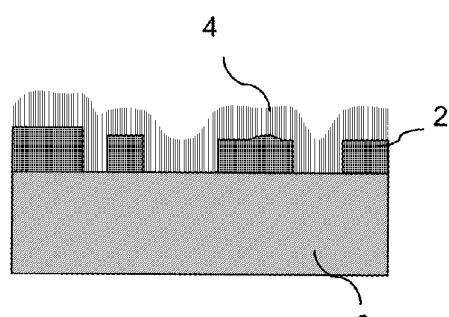
Figure 2D:
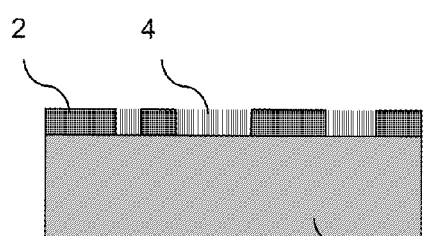
Figure 2E:
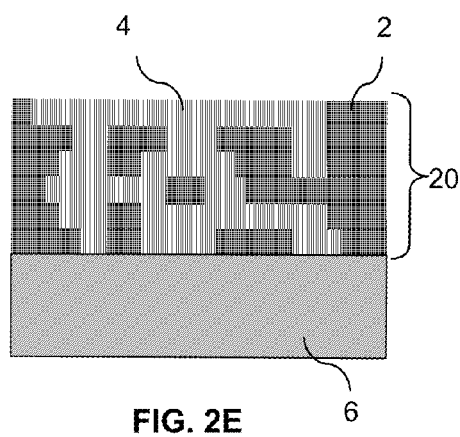
Figure 2F:
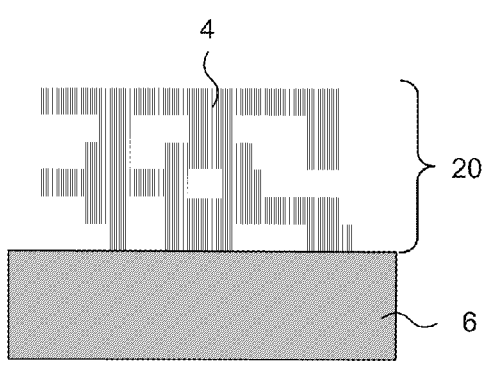
Figure 3A:
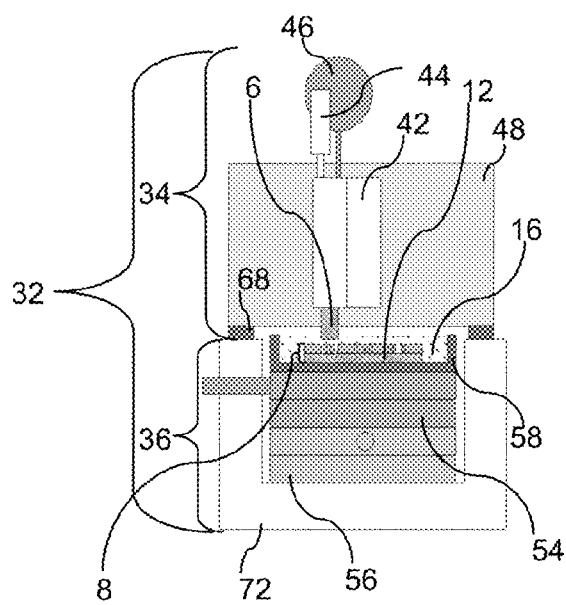
FIGS. 3A-3C schematically depict side views of various example subassemblies that may be used in manually implementing the electrochemical fabrication method depicted in FIGS. 2A-2F.
Figure 3B:
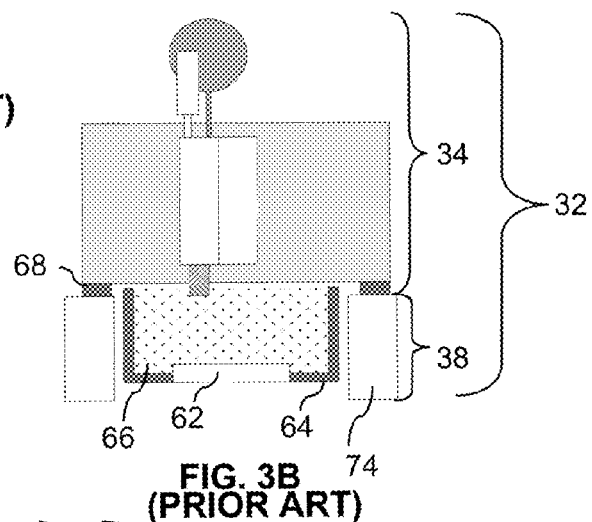
Figure 3C:
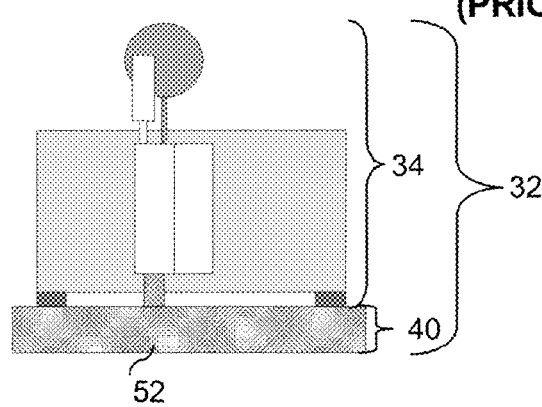

FIGS. 1A-1G, 2A-2F, and 3A-3C illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

FIGS. 4A-4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(a)-92(c). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

The various embodiments, alternatives, and techniques disclosed herein may form multi-layer structures using a single patterning technique on all layers or using different patterning techniques on different layers. For example, different types of patterning masks and masking techniques may be used or even techniques that perform direct selective depositions without the need for masking. For example, conformable contact masks may be used on some layers while non-conformable contact masks and masking operations may be used on other layers. Proximity masks and masking operations (i.e. operations that use masks that at least partially selectively shield a substrate by their proximity to the substrate even if contact is not made) may be used, and adhered masks and masking operations (masks and operations that use masks that are adhered to a substrate onto which selective deposition or etching is to occur as opposed to only being contacted to it) may be used.

FIGS. 5A-5J schematically depict side views of various stages in a process for forming a space transformer from a conductive structural material and from a conductive sacrificial material which may be replaced by a dielectric material. After formation, the substrate side of the space transformer may be bonded to a printed circuit board an interposer or other electrical component while the other side of the space transformer may have probes formed thereon or mounted thereto.

Figure 5A:
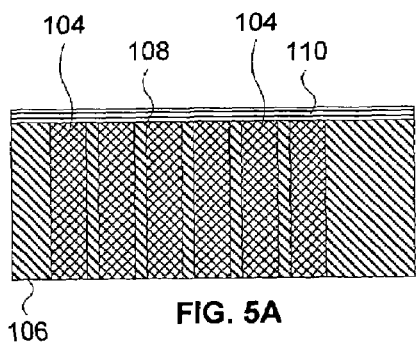
FIGS. 5A-5J schematically depict side views of various stages in a process for forming a space transformer from a conductive structural material and from a conductive sacrificial material which may be replaced by a dielectric material.

FIG. 5A depicts the state of the process after a dielectric (e.g., alumina) substrate 102 is supplied having an array of relatively coarse conductive vias 104 which are composed of a metal that connects the top 108 and bottom surfaces 106 of the substrate. The vias are shown proceeding straight from the bottom surface 106 of the substrate to the top surface 108. In some variations of this embodiment, a circuitous route may be taken by the vias. This embodiment of the invention uses a 'standard' via substrate having vias in an array at a specific, relatively coarse pitch that is compatible with printed circuit board (PCB) line widths. The customization offered by the present embodiment, is accomplished entirely by the deposited layers of material. Typically some vias through the substrate will be used while others will remain unused depending on the specific layout of a particular space transformer. The substrate of the present embodiment is thick and rigid enough to be self-supporting, while in variations of this embodiment the substrate may be flexible. Since the total thickness of the layers to be deposited is typically only on the order of several hundred microns, the substrate provides the rigidity and robustness required for mounting the final space transformer and microprobe combination onto a PCB. As indicated, the substrate is metallized by deposition of a metal film 110 (e.g., by sputtering). The metal film 110 serves as a seed layer and may also serve as an adhesion layer (if necessary), possibly as a barrier layer and/or as a transition layer. In some embodiments the metal film 110 may actually comprise two or more individually applied layers, for example, the film may include an adhesion layer of, e.g., Ti, and a seed layer of, e.g., Au.

Figure 5B:
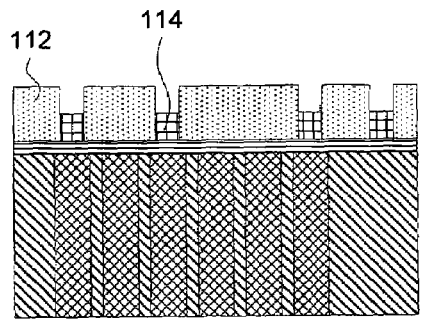

In FIG. 5B, a photoresist 112 has been applied and patterned and a first layer of structural material 114 (e.g. Ni) has been pattern-plated. In some alternative embodiments, sacrificial material may be pattern plated and then structural material may be blanket-plated, and then the layer planarized. Electrical contact (i.e. cathodic contact) may be made via the metal film 110.

Figure 5C:
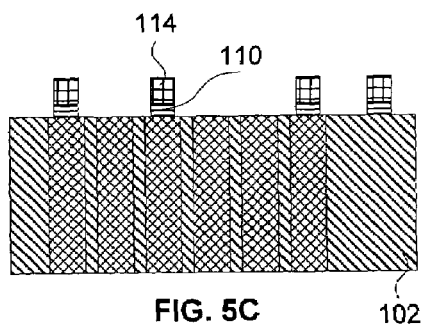

In FIG. 5C, the resist has been stripped and the exposed portion of metal film 110 etched back. The portion of the film located under the deposited structural material 114 is not removed as it is not readily accessible.

Figure 5D:
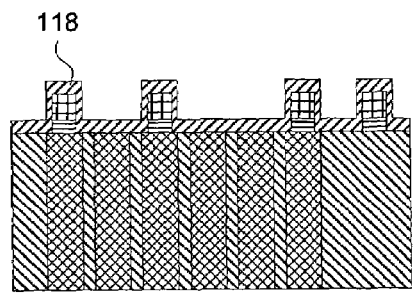

In FIG. 5D, a seed layer of sacrificial material 118 (e.g. Cu) has been deposited by PVD (e.g., sputtering). This seed layer serves as a cathode for subsequent plating and may be used as the contact point for connecting to an electric circuit or alternatively some other conductive element connected to the seed layer may be used as the circuit contact point.

Figure 5E:
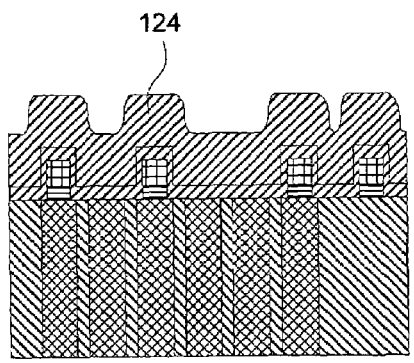

In FIG. 5E, a sacrificial material 124, e.g. Cu, has been thickly plated (e.g. at greater than a desired layer thickness).

Figure 5F:
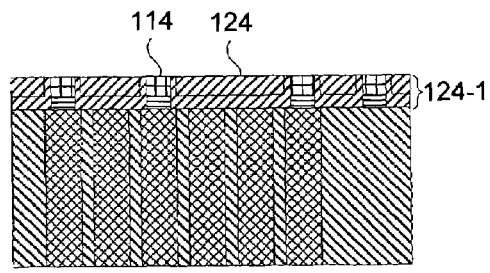

In FIG. 5F the build has been planarized, completing the first layer. Building is then allowed to continue so that additional layers are formed so long as both structural and sacrificial materials are conductive there is no need to apply seed layers during formation of the $2^{nd}$-$N^{th}$ layers. If one of the materials is non-conductive formation of some or all layers may require use of one or more seed layers.

Figure 5G:
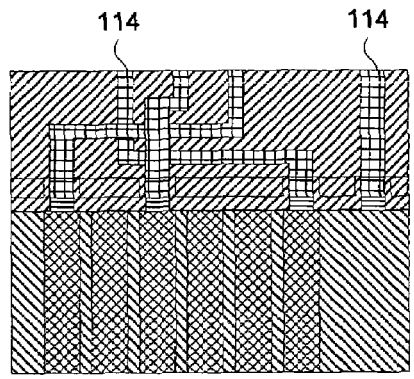

In FIG. 5G, all the layers of the space transformer have been completed with three-dimensional structural material 114 interconnect being embedded in sacrificial material 124 and laid out in a pattern that connects the relatively coarse-pitch vias to the relatively fine-pitch probes or other devices which may be formed on or bonded to the space transformer.

Figure 5H:
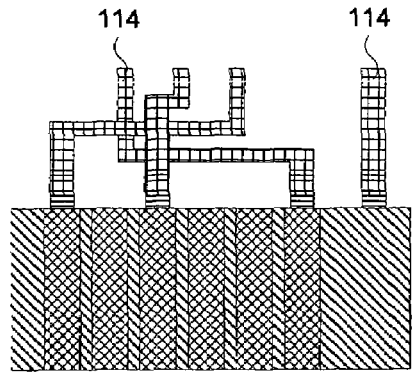

In FIG. 5H, the exposed sacrificial material has been removed to release the interconnect lines of the space transformer. The removal of the sacrificial material may occur by immersing the entire build into sacrificial material etchant. Following etching of the sacrificial material, diffusion bonding (e.g., at 250° C.) may be performed to improve the interlayer adhesion of the layers of structural material. More teaching concerning the use of diffusion bonding in electrochemical fabrication processes may be found in U.S. patent application Ser. No. 10/841,384 which is filed May 7, 2004 by Cohen et al. which is entitled "Method of Electrochemically Fabricating Multilayer Structures Having Improved Interlayer Adhesion" and which is hereby incorporated herein by reference as if set forth in full.

Figure 5I:
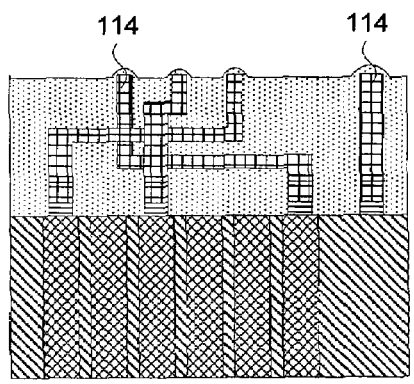
Figure 5J:
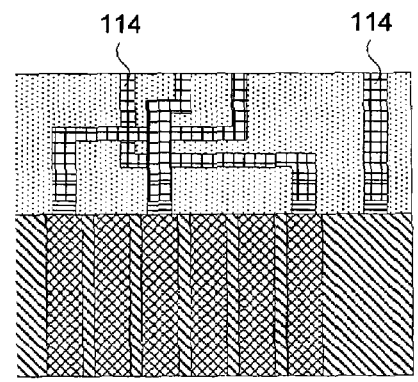

In some variations of the present embodiment, solder bumps may be located on the under side of the substrate to aid mounting of the space transformer to a circuit board or the like. In still other embodiments solder bumps may be located on the ends of the interconnect elements in preparation for bonding probes or other components to the space transformer. In still other embodiments diffusion bonding may occur prior to the release of FIG. 5H. In some embodiments, the release of the interconnect elements from the sacrificial material may complete formation of the space transformer as it is intended that the interconnect elements be free standing. In still other embodiments the interconnect elements may not be free standing but instead be embedded in a dielectric material. FIG. 5I depicts the state of the process after such an embedment occurs while FIG. 5J depicts the state of the process after a planarization operation removes any excess dielectric from above the interconnect elements formed of material 114.

FIGS. 6A-6L schematically depict side views of various stages in a process for forming a space transformer from a conductive structural material and from a conductive sacrificial material wherein a dielectric lid is formed over the structure and the sacrificial material is removed which may be replaced by a dielectric material.

Figure 6A:
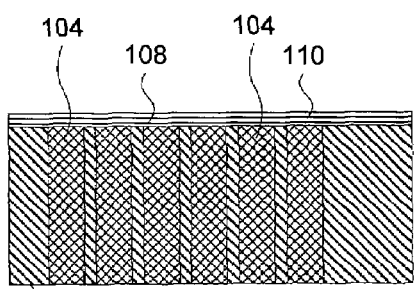
FIGS. 6A-6L schematically depict side views of various stages in a process for forming a space transformer from a conductive structural material and from a conductive sacrificial material wherein a dielectric lid is formed over the structure and the sacrificial material is removed which may be replaced by a dielectric material.
Figure 6B:
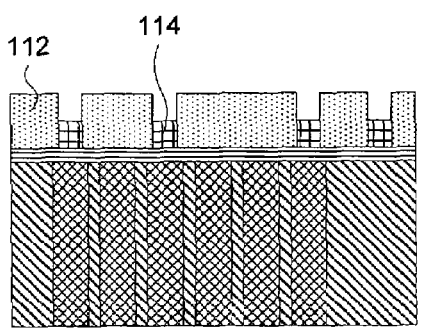
Figure 6C:
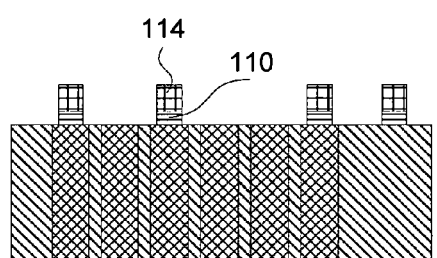
Figure 6D:
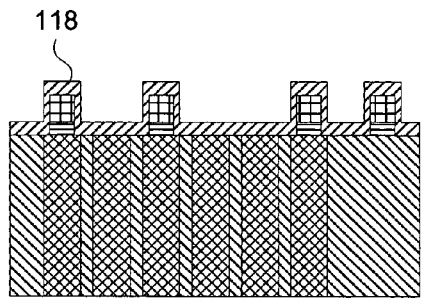
Figure 6E:
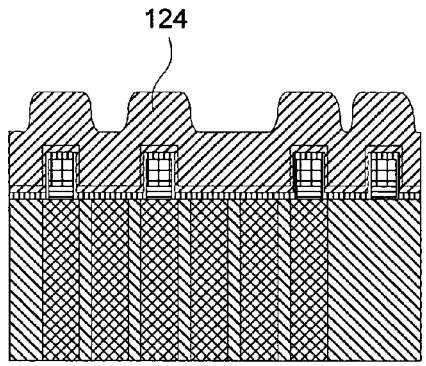
Figure 6F:
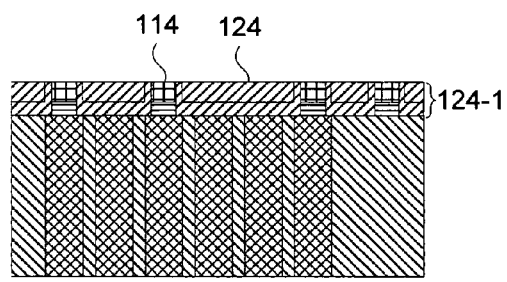
Figure 6G:
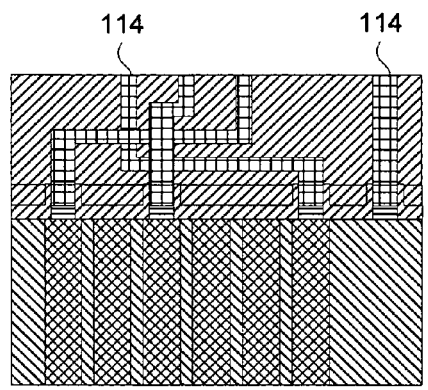

FIGS. 6A-6G are identical to FIGS. 5A-5G with the exception that the building of layers of the space transformer are not complete after the processing that lead to FIG. 6G.

Figure 6H:
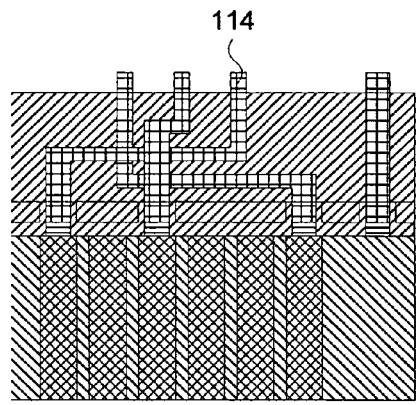

In FIG. 6H, structural material 114 has been pattern-plated to form what will become fine-pitch vias which will extend through an insulating layer that will next be fabricated. The pattern plating may occur in a variety of ways, such as by use of a temporarily placed and patterned photoresist that is removed after plating of material 114.

Figure 6I:
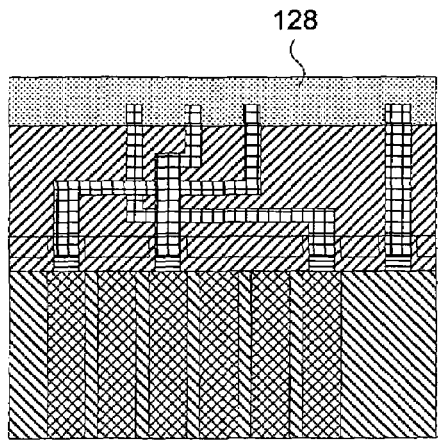

In FIG. 6I a high-temperature resistant dielectric material 128 (e.g., polyimide, glass, or the like) has been applied and (if needed) cured.

Figure 6J:
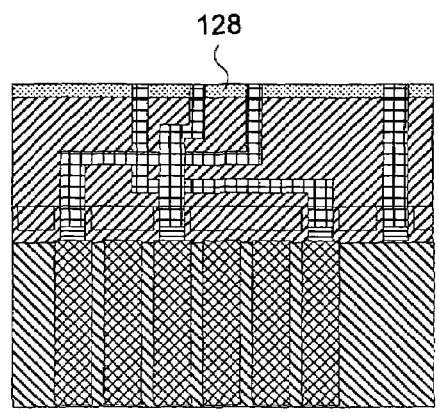

In FIG. 6J the state of the process is shown after a planarization operation has removed excess dielectric material 128 and set the heights of materials 114 and 128 to a desired common level. The planarization operation removes the dielectric that lays over the structural material and leaves in place a dielectric layer that will form a 'roof' for the space transformer.

Figure 6K:
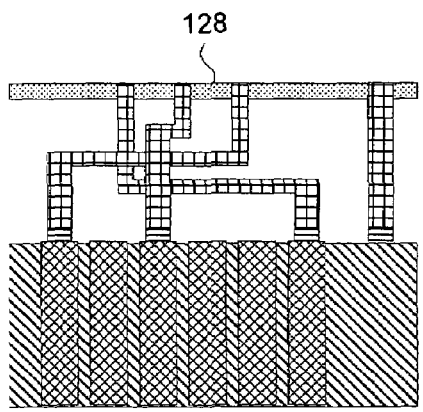

In FIG. 6K, like in FIG. 5H, the exposed sacrificial material has been removed to release the interconnect lines of the space transformer. As with the above discussion of FIG. 5H, diffusion bonding may occur before or after release of the structure or it may not occur at all.

Figure 6L:
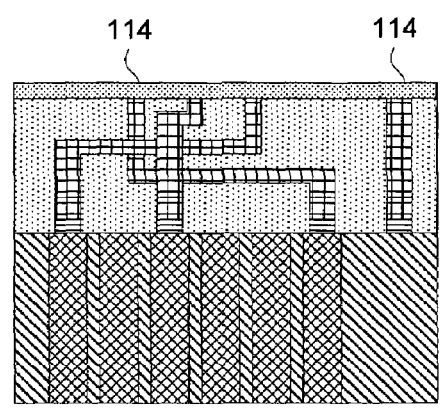

In some variations of the present embodiment, solder bumps may be located on the under side of the substrate to aid mounting of the space transformer to a circuit board or the like. In still other embodiments solder bumps may be located on the ends of the interconnect elements exposed through the top of dielectric material 128 in preparation for bonding probes or other components to the space transformer. In some embodiments, the release of the interconnect elements from the sacrificial material may complete formation of the space transformer as it is intended that the interconnect elements be free standing with some added support offered by the dielectric material 128 that caps the space transformer. In still other embodiments the interconnect elements may not be free standing but instead be embedded in a dielectric material. FIG. 6L depicts the state of the process after such an embedment occurs.

FIGS. 7A-7F schematically depict side views of various stages in a process for forming a space transformer from a conductive structural material and from a dielectric structural material that is also a patterning material. The build process of FIGS. 7A-7F are based on the use of non-planar seed layers as taught in U.S. patent application Ser. No. 10/841,300 which is hereby incorporated herein by reference.

Figure 7A:
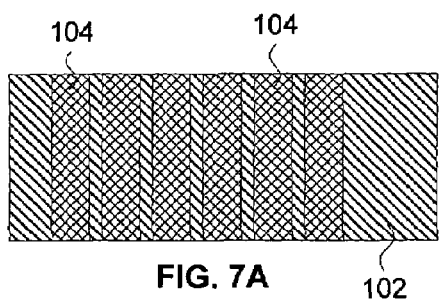
FIGS. 7A-7F schematically depict side views of various stages in a process for forming a space transformer from a conductive structural material and from a dielectric structural material that is also a patterning material.

FIG. 7A depicts the state of the process after a substrate 102 is supplied. As with FIGS. 5 and 6, substrate 102 contains vias 104 that extend from a lower surface of the substrate to an upper surface of the substrate.

Figure 7B:
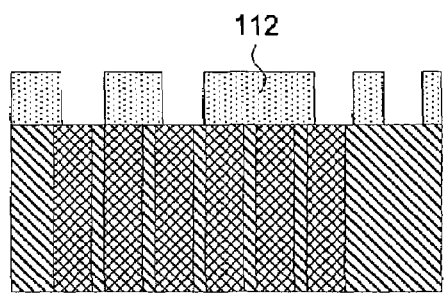

FIG. 7B depicts a state of the process after a dielectric 112 is placed on the upper surface of the substrate and is patterned. The patterning of the dielectric material may occur before or after locating the material on the substrate. In some embodiments the dielectric material 112 may be a photoresist.

Figure 7C:
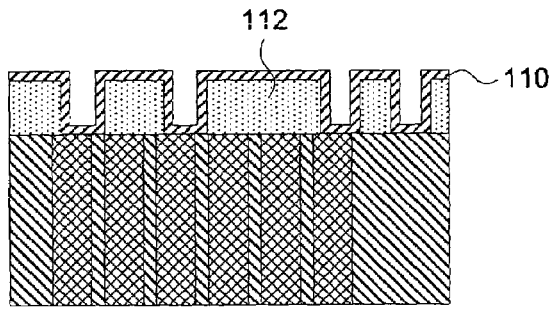

FIG. 7C depicts the state of the process after a seed layer 110 is deposited over the dielectric material 112 and into the voids or openings that extend through the dielectric material.

Figure 7D:
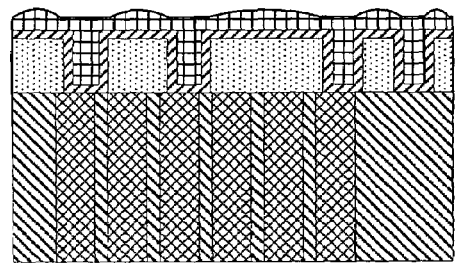

FIG. 7D depicts a state of the process after a conductive material 114 is plated over seed layer 110.

Figure 7E:
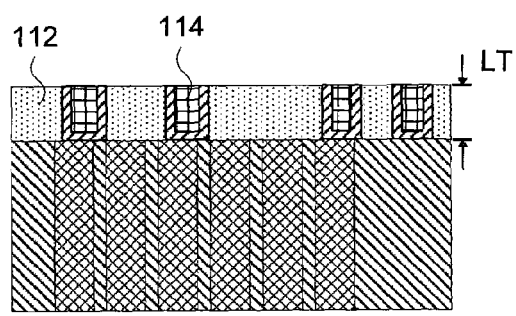

FIG. 7E depicts the state of the process after a planarization process trims the height of the dielectric material 112, seed layer 110 and conductive material 114 to a height corresponding to the layer thickness LT. FIG. 7E depicts a state of the process after formation of the first layer is completed.

Figure 7F:
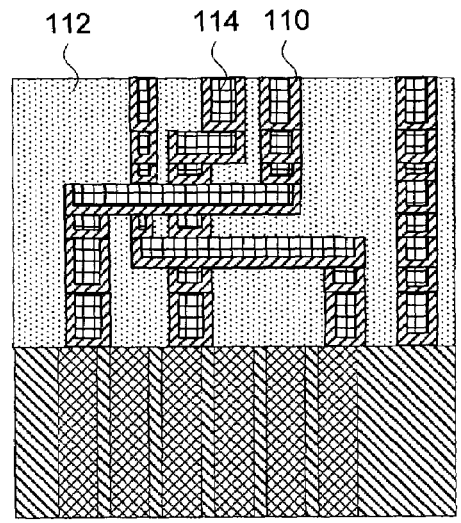

FIG. 7F depicts the state of the process after formation of a plurality of layers which completes formation of the space transformer.

FIGS. 8A-8I schematically depict side views of various stages in a process for forming a space transformer from a conductive structural material and from a dielectric structural material that is not a patterning material.

Figure 8A:
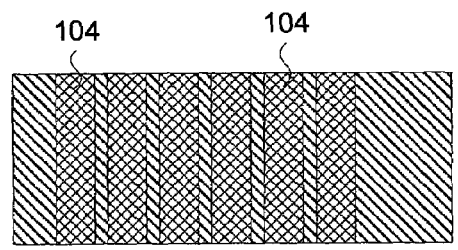
FIGS. 8A-8I schematically depict side views of various stages in a process for forming a space transformer from a conductive structural material and from a dielectric structural material that is not a patterning material.
Figure 8B:
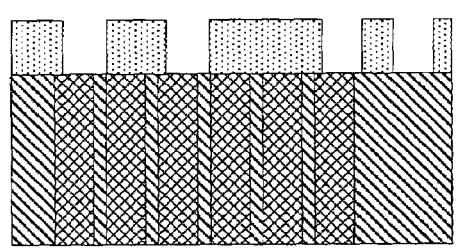
Figure 8C:
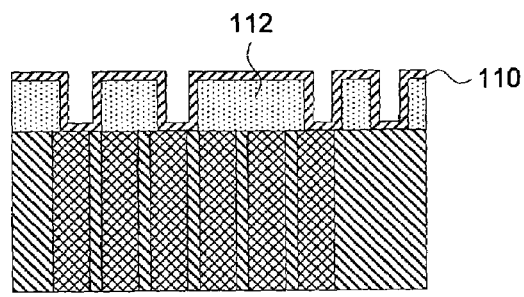
Figure 8D:
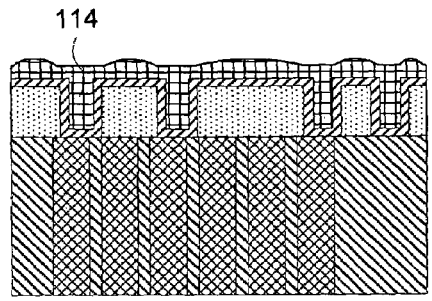
Figure 8E:
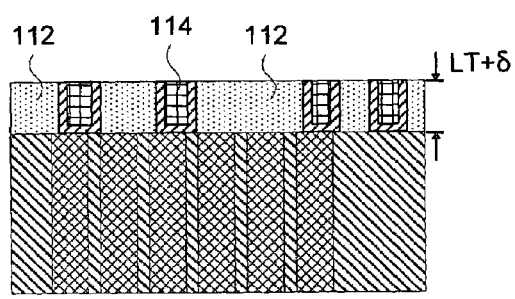

FIG. 8A-8E are similar to FIGS. 7A-7E already discussed with the exception that the height of planarization of FIG. 8E is set at slightly more then one layer thickness (LT+δ) as opposed to being set at the layer thickness (LT) as in FIG. 7E.

Figure 8F:
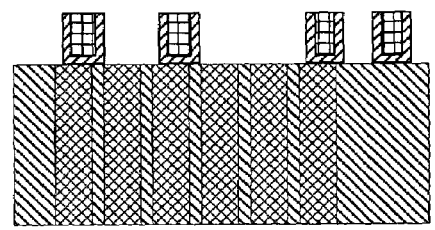

FIG. 8F shows the state of the process after dielectric material 112 has been removed.

Figure 8G:
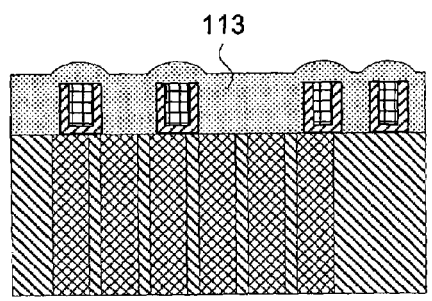

FIG. 8G shows the state of the process after a second dielectric material 113 has been applied where the application is shown in this example to have slightly over coated regions of structural material 114.

Figure 8H:
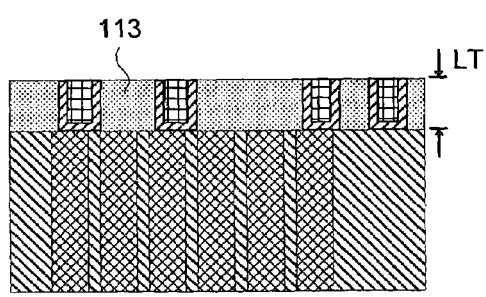

FIG. 8H shows the state of the process after a planarization operation trims the height of deposited materials to that of the layer thickness.

Figure 8I:
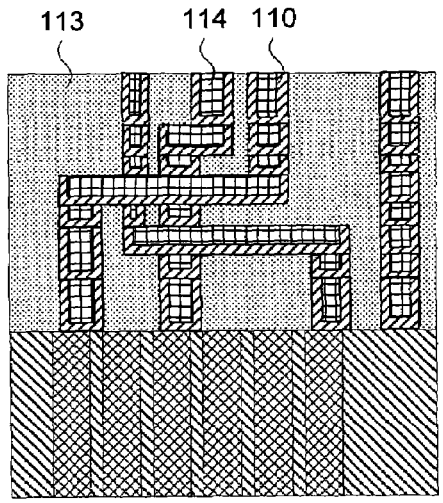

FIG. 8I shows a similar state of the process as shown in FIG. 7F where the formation of the space transformer is completed and is imbedded in a desired dielectric material. In FIG. 8I the dielectric material is shown to be different from an initial dielectric material that was used for patterning operation where as in FIG. 7F the patterning dielectric and structural dielectrics were the same.

Figure 9A:
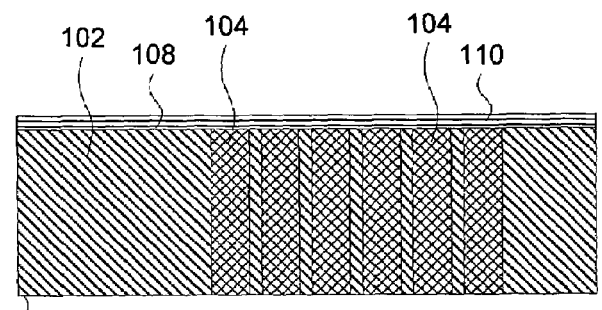
FIGS. 9A-9O schematically depict side views of various stages in a process for forming a space transformer, including formation and maintenance of substrate end pointing regions from a conductive structural material and a conductive sacrificial material which is removed and may be replaced by a dielectric material.
Figure 9B:
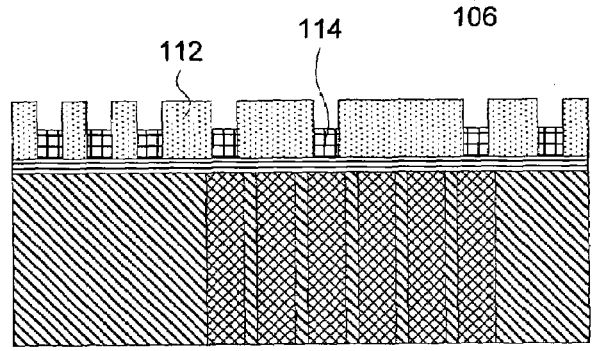
Figure 9C:
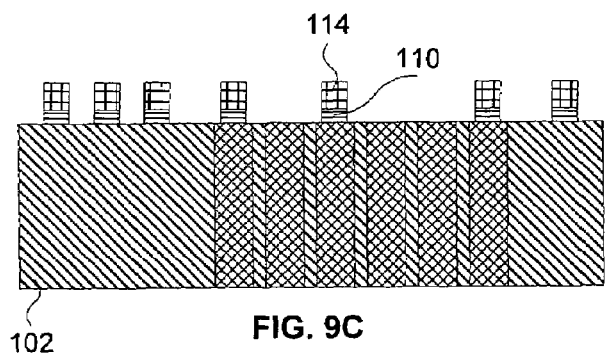
Figure 9D:
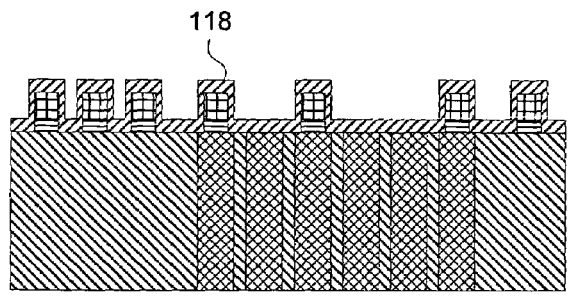
Figure 9E:
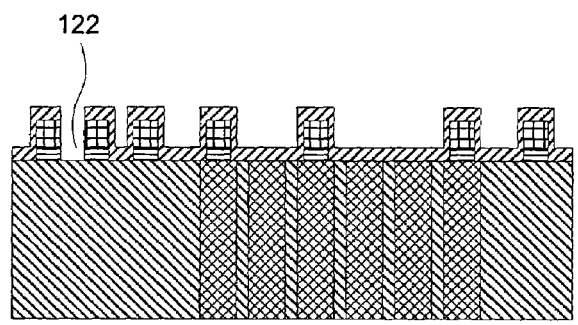
Figure 9F:
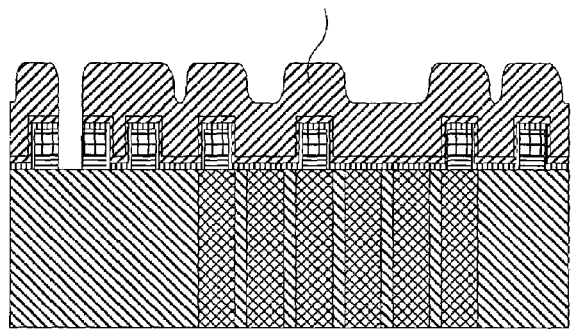
Figure 9G:
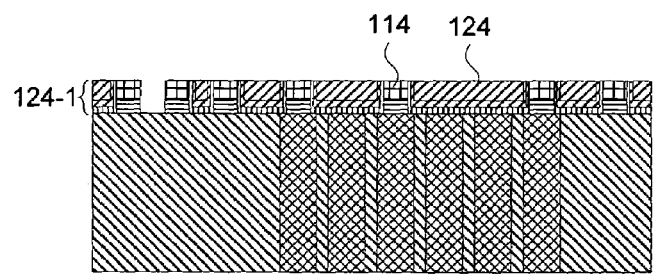
Figure 9H:
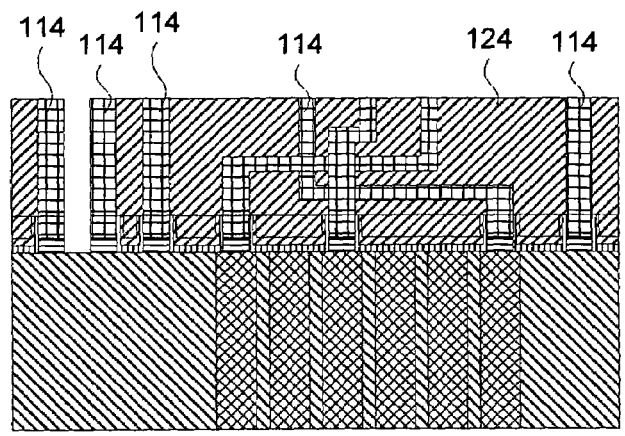
Figure 9I:
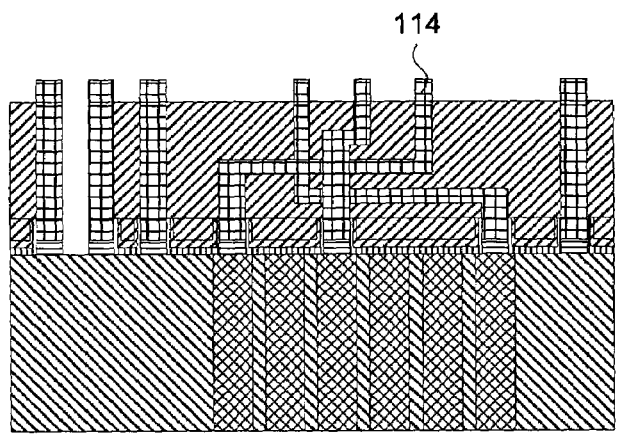
Figure 9J:
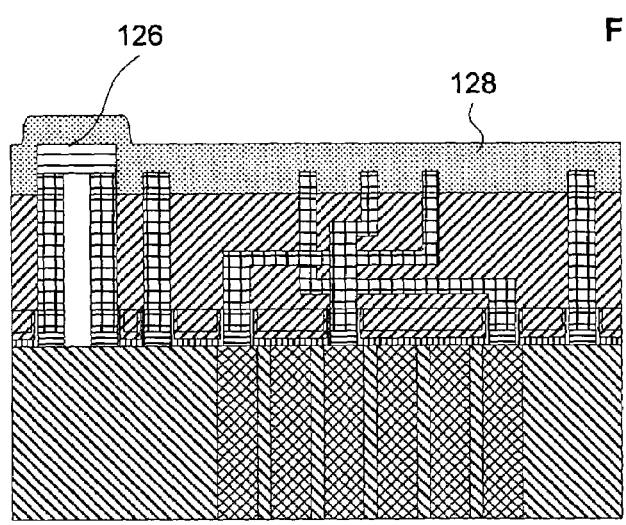
Figure 9K:
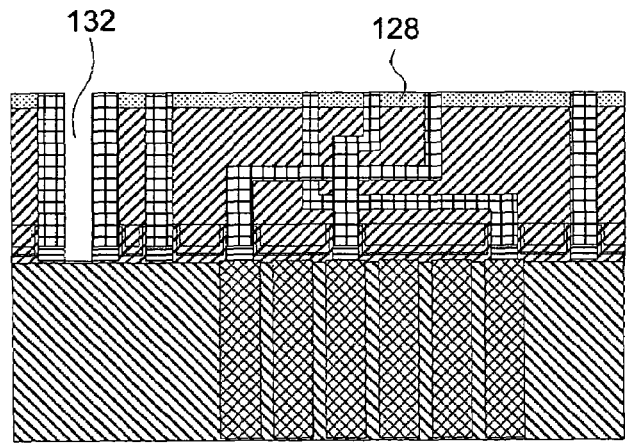
Figure 9L:
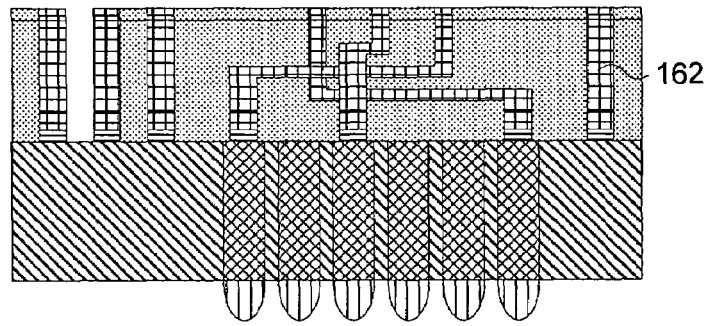
Figure 9M:
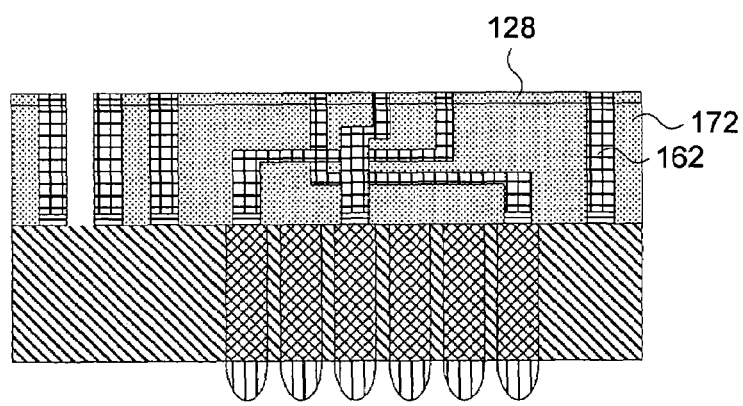
Figure 9N:
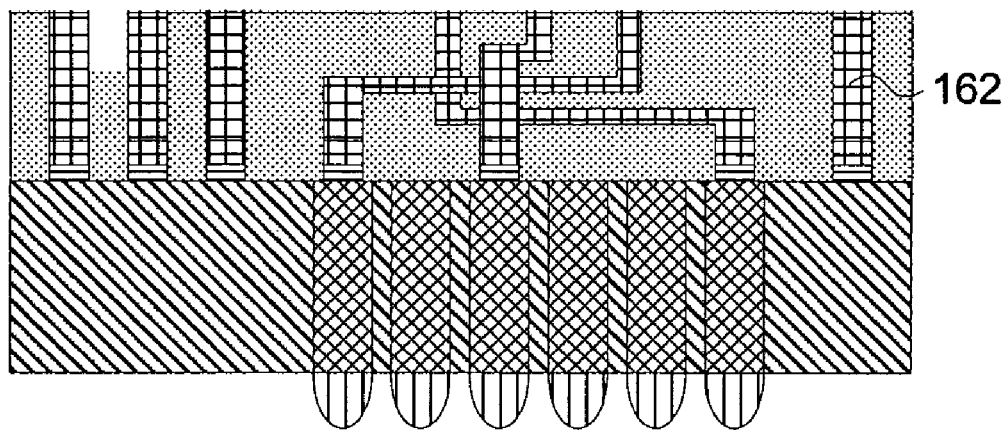
Figure 9O:
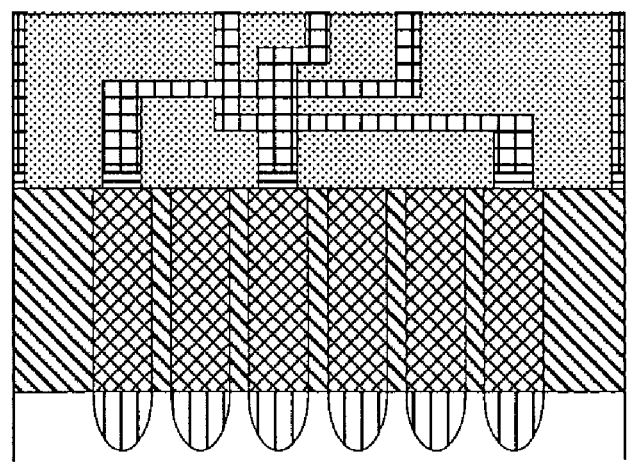

FIGS. 9A-9O schematically depict side views of various stages in a process for forming a space transformer, including formation and maintenance of substrate end pointing regions from a conductive structural material and a conductive sacrificial material which is removed and may be replaced by a dielectric material.

FIG. 9A depicts the state of the process after a dielectric (e.g., alumina) substrate 102 is supplied having an array of relatively coarse conductive vias 104 which are composed of a metal that connects the top 108 and bottom surfaces 106 of the substrate and on which a seed layer 110 has been applied. The state of the process is similar to that discussed in association with FIG. 5A.

In FIG. 9B, a photoresist 112 has been applied and patterned and a first layer of structural material 114 (e.g. Ni) has been pattern-plated. The state of the process is similar to that discussed in association with FIG. 5B.

In FIG. 9C, the resist has been stripped and the exposed portion of metal film 110 etched back. The portion of the film located under the deposited structural material 114 is not removed as it is not readily accessible. The state of the process is similar to that discussed in association with FIG. 5C.

In FIG. 9D, a seed layer of sacrificial material 118 (e.g. Cu) has been deposited by e.g. PVD (e.g. sputtering). The state of the process is similar to that discussed in association with FIG. 5D.

In FIG. 9E, the seed layer is shown as having been etched away from an area of an end-point detection region 122 (additional end point detection pads may exist on the substrate but are just not visible from the view provided by FIG. 9E. This removal may, for example, occur by use of a patterned mask that is formed after which etching is allowed to occur, and then the mask removed. This removal of the seed layer prevents metal from being plated up in this region. Of course, in practice the end point detection region 112 will need to be wide enough so that plating of metal occurring via a mushrooming effect from the side walls of structural material 112 which surrounds end-point detection pad 122 will not result in the covering of the pad. In alternative embodiments, at the time of application of seed layer and adhesion layer material the end-point detection region may be shielded so as to not receive the materials.

In FIG. 9F, a sacrificial material 124, e.g. Cu, has been thickly plated (e.g. at greater than a desired layer thickness). In FIG. 9G the build has been planarized, completing the first layer. Building is then allowed to continue so that additional layers are formed so long as both structural and sacrificial materials are conductive there is no need to apply a seed layer during formation of the $2^{nd}$-$N^{th}$ layers. If one of the materials is non-conductive formation of some or all layers may require use of one or more seed layers. In FIG. 9H, all the layers of the space transformer portion of the build have been completed (with the exception of a capping layer) with three-dimensional structural material 114 interconnect being embedded in sacrificial material 124 and laid out in a pattern that connects the relatively coarse-pitch vias to the relatively fine-pitch probes or other components which may be formed on the space transformer or which may be bonded to the space transformer after formation.

In FIG. 9I, structural material 114 has been pattern-plated to form what will become fine-pitch vias which will extend through an insulating layer that will next be fabricated. In FIG. 9J, a cap 126 has been applied over the endpoint detection region or area and a high-temperature resistant dielectric material 128 (e.g., polyimide, glass, or the like) has been applied and (if needed) cured.

In FIG. 9K, the cap has been removed and the build has been planarized (and if necessary the opening 132 above the end-point detection pad has been cleaned of debris from the planarization operation. In some embodiments that cap may be removed as part of the planarization operation while in other embodiments it may be removed in a separate operation. The planarization operation removes the dielectric that lays over the structural material vias of FIG. 9I and leaves in place a dielectric layer that will form a 'roof' for the space transformer portion of the device.

In FIG. 9L, the exposed sacrificial material has been removed to release the structure. The sacrificial material may be removed by immersing the entire build into sacrificial material etchant. The release occurs substantially in a lateral manner, with etchant flowing under the roof or cap structure 128 and around structural material interconnects and structural material pillars 162 that may be used to support the roof of the space transformer (e.g., one in each corner of the device, or spaced out at intervals around the perimeter).

In some variations of the present embodiment, solder bumps may be located on the under side of the substrate to aid mounting of the space transformer to a circuit board or the like. In still other embodiments solder bumps may be located on the ends of the interconnect elements exposed through the top of dielectric material 128 in preparation for bonding probes or other components to the space transformer. In some embodiments, the release of the interconnect elements from the sacrificial material may complete formation of the space transformer as it is intended that the interconnect elements be free standing with some added support offered by the dielectric material 128 that caps the space transformer. In still other embodiments the interconnect elements may not be free standing but instead be embedded in a dielectric material. FIG. 6L depicts the state of the process after such an embedment occurs.

In FIG. 9M, a back fill material 172 has been infiltrated into the structure between the substrate and cap 128 and cured to fill the voids in the space transformer. In the present embodiment the back fill material is an epoxy material. In variations of the embodiment, further restrictions on accessibility of the backfill material to certain regions may be implemented. Since the interconnects are fastened at both ends, it is believed that, with careful backfilling, they will be able to resist deformation and shorting to one another during the filling process.

In FIG. 9N, cap 128 has been removed via a planarization operation. In some alternative embodiments, cap 128 could remain as part of the space transformer.

In FIG. 9O, the build has been diced to allow separation of individual package dies. After dicing, debris is removed (e.g., by megasonic or ultrasonic cleaning). As shown, the dicing may leave behind a portion of the Ni pillars (in the transformer region), whereas in variations of this embodiment, the pillars may be removed in their entirety or left in their entirety.

In some embodiments of the invention a space transform may be formed with coaxial interconnects to allow improved signal transmission and reduced interference. The space transformer coaxial interconnects may include a center conductor surrounded by a metallic shield and separated by a dielectric (e.g. a patterned polymer). Coaxial space transformers offer improved performance when used, for example, to probe high-frequency semiconductors, and/or when carrying higher currents (e.g., for logic semiconductor probing). Some such embodiments are illustrated in FIGS. 10A-10C, 11A-11K, and 12.

As noted above according to some embodiments of the invention, a space transformer may be fabricated using a patterned polymer, a non-planar seed layer, and a plated material such as Cu. The patterned polymer may be for example, polyimide (e.g. photopatternable polyimide such as HD-4000 from HD Microsystems), benzocyclobutene (e.g., photopatternable BCB such as Cyclotene 4000 from Dow Corning), or photoresist (e.g., SU-8 from MicroChem). BCB is particularly resistant to Cu etchants, allows lower processing temperatures, and offers relative immunity to Cu migration, and allows high-frequency performance.

Figure 10A:
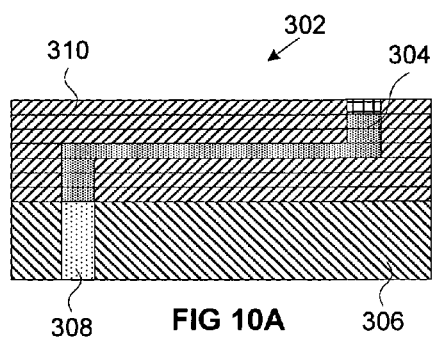
FIGS. 10A-10C provide side views of three simplified interconnect configurations that may be used in a space transformer.

FIG. 10A shows a simplified space transformer 302 which has a single interconnect 304 that is an unshielded conductor embedded in a dielectric material 310. The space transformer is built on a substrate 306 that has a metal-filled (i.e., conductive) via 308.

Figure 10B:
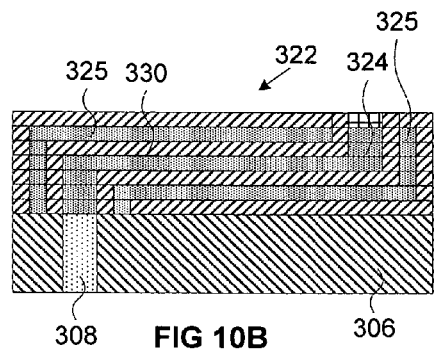

FIG. 10B shows a coaxial space transformer 322 in which the interconnect 324 is surrounded by a shield 325, and in which the shield is of roughly constant thickness, with its exterior surface following the path of the interconnect.

Figure 10C:
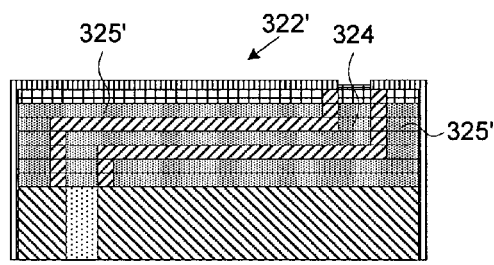

FIG. 10C shows another embodiment of a coaxial space transformer 322' in which the interconnect 324 is surrounded by shielding material 325' of varying thickness. In effect, this type of space transformer is a solid block of metal (i.e. the shield material 325') pierced with holes, each of which is filled with a conductor (i.e. the interconnects 324) surrounded by dielectric 330. Adjacent interconnects thus share a common shield. In some embodiments, the shielding material may be surrounded by a dielectric material and may make contact with a ground structure.

There may be several benefits of a "solid block space transformer (SBST)" (e.g. as illustrated in FIG. 10C)' vs. the space transformer shown in FIG. 10B due to the fact that there is relatively little dielectric in the final structure: (1) the average coefficient of thermal expansion (CTE) of the space transformer layers is reduced to a value closer to that of the metal than the dielectric, providing a better match for the substrate CTE, especially if this is a ceramic, Si, etc; (2) dielectric materials with poorer mechanical properties (e.g., photoresist) can be used successfully, since the mechanical integrity of the structure derives largely from the metal; (3) heat can be more easily dissipated; (4) overall rigidity is increased; and/or (5) regions of dielectric on a given layer are fewer and smaller, facilitating single point diamond machining of the layer by (a) reducing the risk of delamination and with less need for 'pinking' and b) reducing the amount of Cu (or other metal) that must be removed by diamond machining (i.e., most of the Cu that is removed is that which is over small regions of dielectric). Pinking is explained more fully in U.S. Patent Application No. 60/574,733 entitled "Methods for Electrochemically Fabricating Structures Using Adhered Masks, Incorporating Dielectric Sheets, and/or Seed layers That Are Partially Removed Via Planarization", filed by Lockard et al., which is hereby incorporated herein by reference as if set forth in full. Moreover, the solid block space transformer requires formation and patterning of fewer small features on most layers.

Figure 11A:
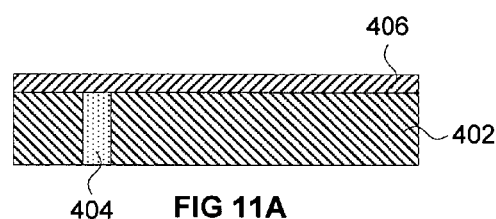
FIGS. 11A-11L provide schematic side views of various states in a process of forming a coaxial space transformer.
Figure 11B:
Figure 11C:
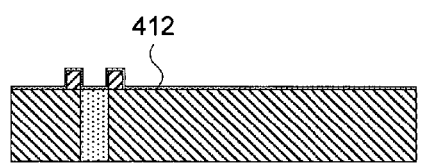

FIGS. 11A-11K shows the process for fabricating an SBST on a substrate with vias, using a patterned polymer/non-planar seed layer/plated metal approach. In FIG. 11A, a substrate 402 with vias 404 has been coated with a polymer 406 to a thickness greater than the desired layer thickness. In FIG. 11B, the polymer has been patterned. In FIG. 11C, interconnect material 412 (e.g. Cu) has been deposited by PVD (preferably sputtering) or the like. If necessary for adhesion or as a barrier layer (e.g., in the case of polyimide) to Cu migration, Ti or Cr can be deposited before the Cu. If Ti or Cr is used as a barrier layer, since there won't be any on down-facing polymer surfaces over Cu, then Cu diffusion may still occur in an upward direction. This be managed in a variety of ways, for example, by providing extra space between horizontal portions of the interconnects.

Figure 11D:
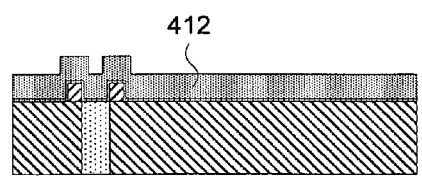
Figure 11E:
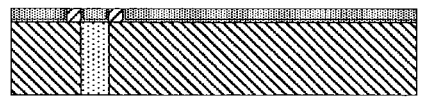

In FIG. 11D, interconnect material (e.g. Cu) 412 has been plated to a thickness greater than the desired layer thickness. In FIG. 11E, the layer has been planarized, preferably by diamond machining or possibly lapping.

Figure 11F:
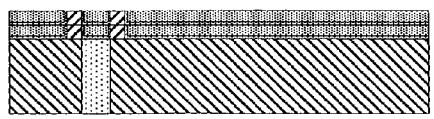
Figure 11G:
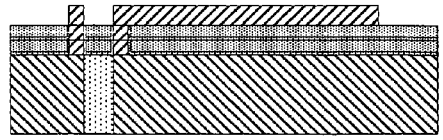
Figure 11H:
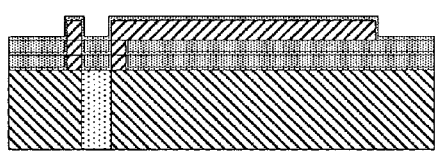
Figure 11I:
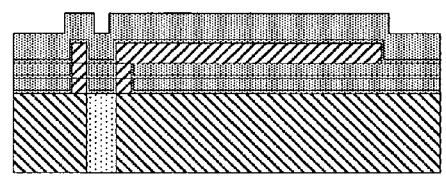
Figure 11J:
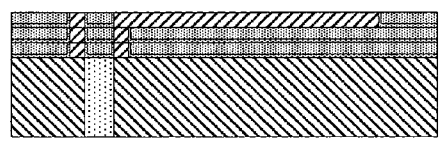

In FIG. 11F, the previous operations have been repeated to fabricate a second layer. In FIGS. 11G-11I, the previous operations have been repeated to fabricate a third layer. FIG. 11J depicts the state of the process after forming the $4^{th}$ through $7^{th}$ layers where the last layer is formed with a capping of gold or other metal that is resistant to Cu etching (assuming the interconnect material is copper and such a barrier is necessary). The deposition of the last layer may occur by a combination of patterning, sputtering, plating, and planarization. It is desirable to avoid the use of copper on the last layer in those embodiments where copper will be placed above the space transformer (e.g. as a sacrificial material that surrounds probes that will be bonded to the space transformer) and then etched away. It should be noted that the seed layers shown explicitly in FIGS. 11D-11I have been removed from view in FIGS. 11J and 11K for simplicity.

Figure 11K:
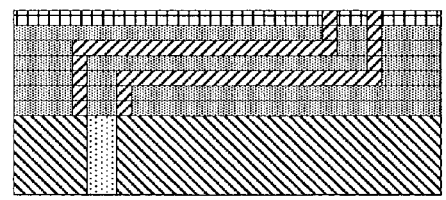
Figure 11L:
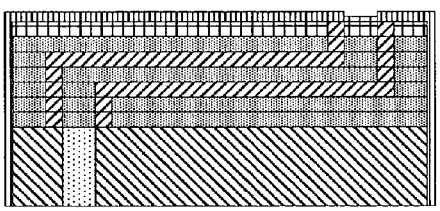
Figure 12:
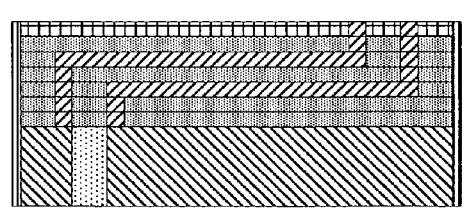
FIG. 12 provides a schematic side view of an alternative technique for shielding sidewalls of a space transformer.

Finally, in FIG. 11K, the space transformer has been diced from a larger wafer and a patterned passivation layer has been added to protect the shielding material (e.g. Cu) particularly along the sidewalls. This passivation layer may be used to protect the copper in the space transformer from an etchant that may be used to remove a sacrificial copper material from probe structure that may be formed on the space transformer or bonded to the space transformer. If desired a gold cap may then be added (e.g., by plating) over the interconnect region(s) in order to reduce the depth of the pad within the passivation. The passivation (e.g., photopatternable BCB) may be the same polymer that is used to fabricate the layers or a different one, as long as it is resistant to the Cu etchant. If applied as shown, since the passivation also coats the polymer from which the layers are formed, then this polymer (e.g., polyimide) can be of a type that is not very resistant to attack by the Cu etchant. It is also possible, since the Au layer protects the Cu from above, to protect the sidewalls using a non-patterned material simply applied to the sidewalls as shown in FIG. 12.

Figure 13A:
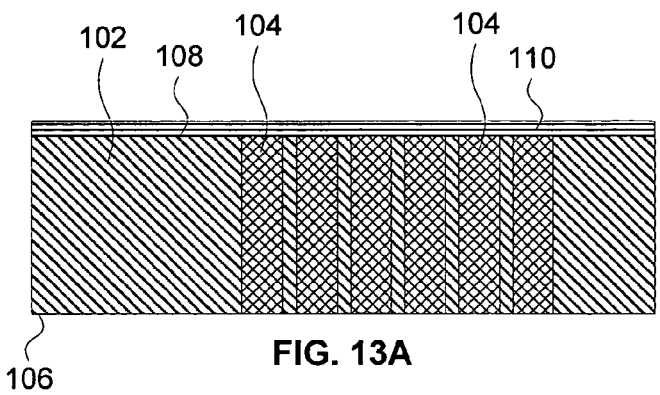
FIGS. 13A-13X depict schematic representations of side views of various states of a process according to a first embodiment of the invention which calls for the co-fabrication of a set of microprobes and a space transformer.
Figure 13B:
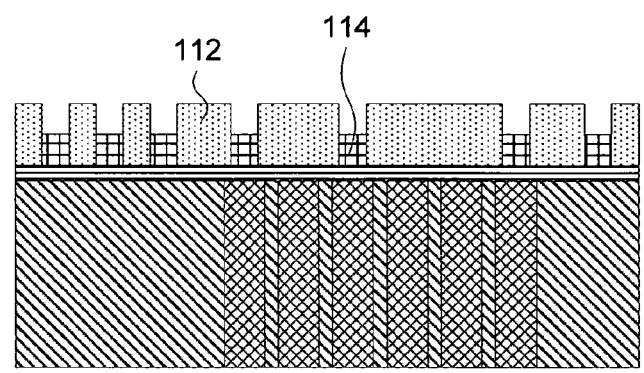
Figure 13C:
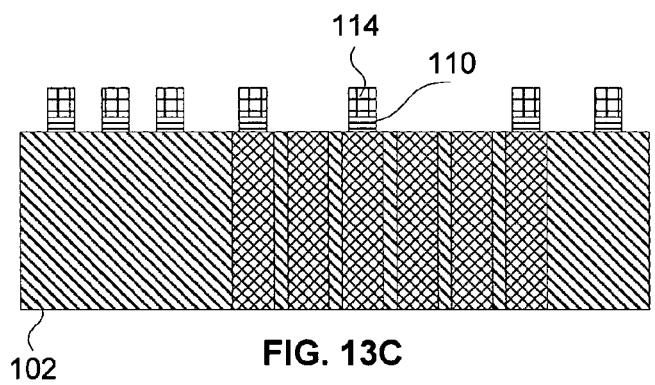
Figure 13D:
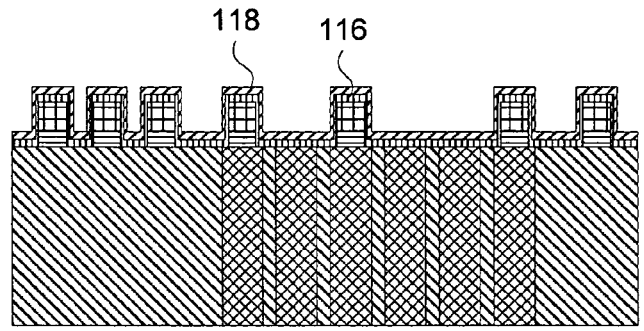
Figure 13E:
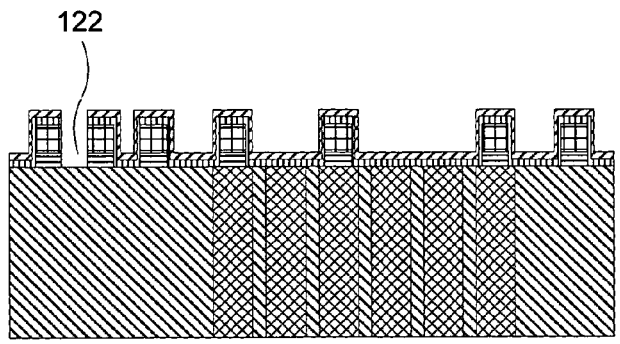
Figure 13F:
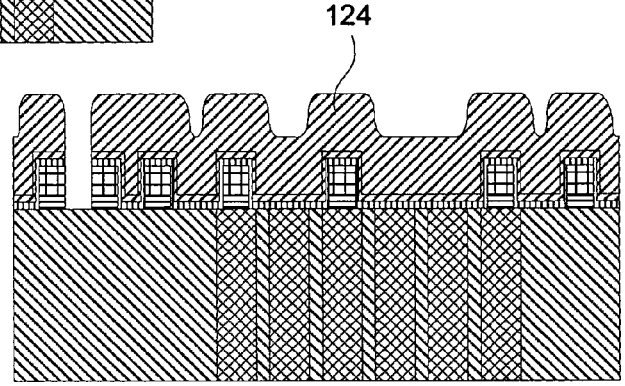
Figure 13G:
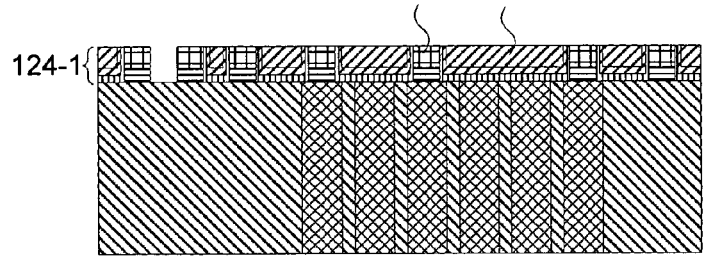
Figure 13H:
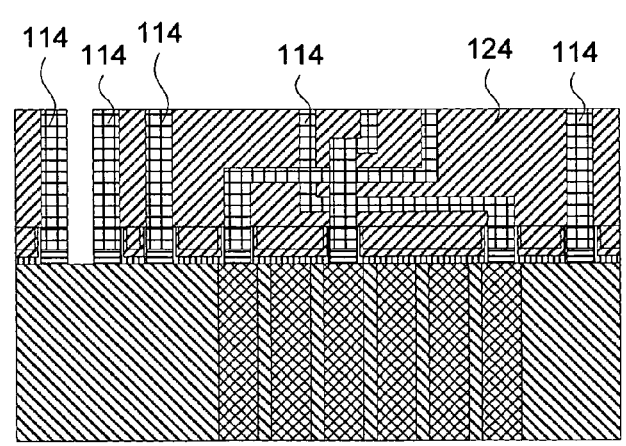
Figure 13I:
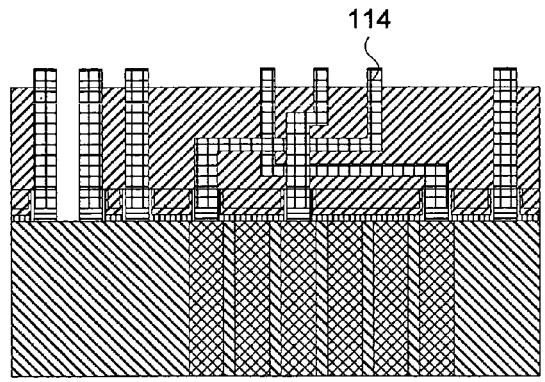
Figure 13J:
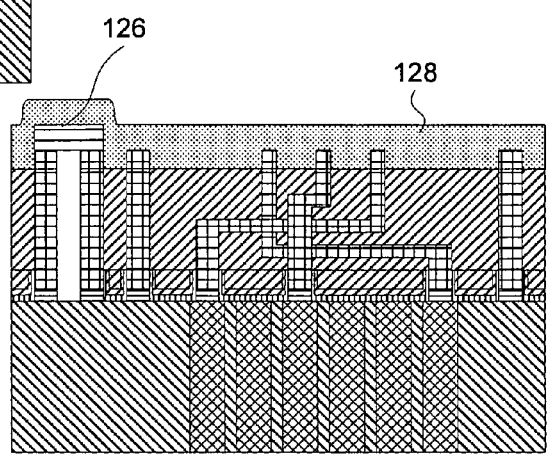
Figure 13K:
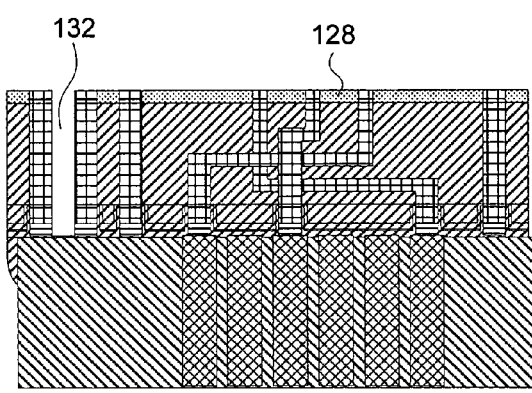
Figure 13L:
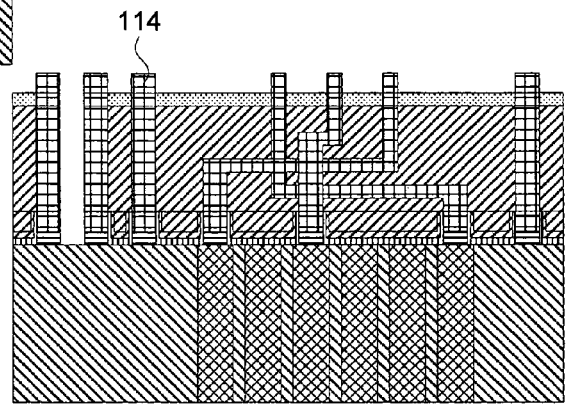
Figure 13M:
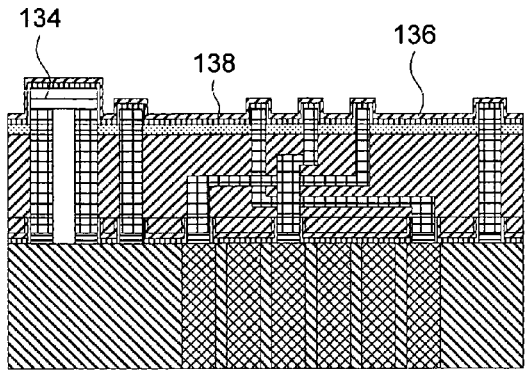
Figure 13N:
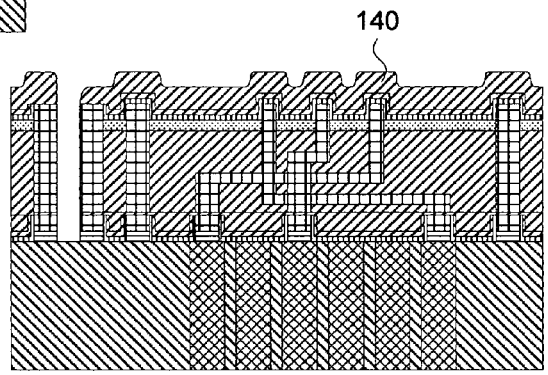
Figure 13O:
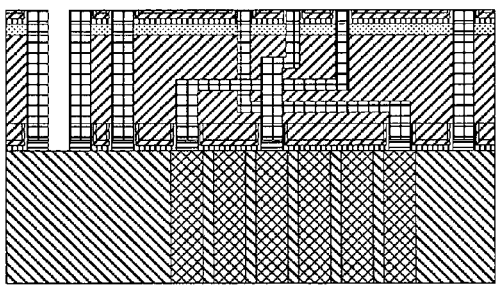
Figure 13P:
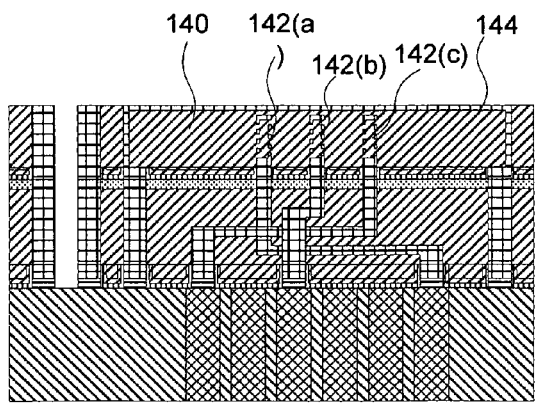
Figure 13U:
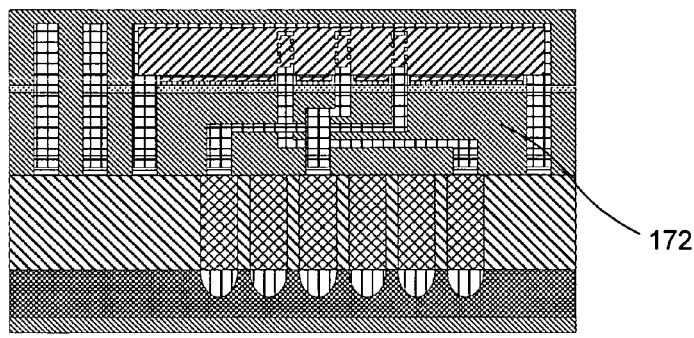
Figure 13V:
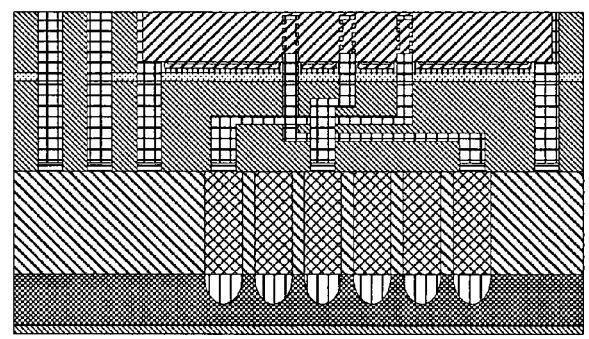
Figure 13W:
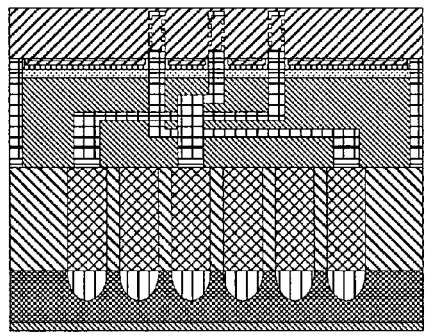
Figure 13X:
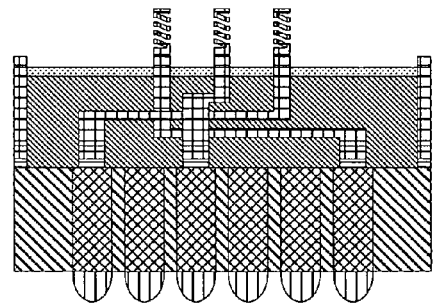

FIGS. 13A-13X depict schematic representations of side views of various states of a process according to a first embodiment of the invention which calls for the co-fabrication of a set of microprobes and a space transformer which can be mounted to a PCB.

FIG. 13A depicts the state of the process after a dielectric (e.g., alumina) substrate 102 is supplied having an array of relatively coarse conductive vias 104 which are composed of a metal that connects the top 108 and bottom surfaces 106 of the substrate. The vias are shown proceeding straight from the bottom surface 106 of the substrate to the top surface 108. In some variations of this embodiment, a circuitous route may be taken by the vias. This embodiment of the invention uses a 'standard' via substrate having vias in an array at a specific, relatively coarse pitch that is compatible with PCB line widths. The customization offered by the present embodiment, is accomplished entirely by the deposited layers of material. Typically some vias through the substrate will be used while others will remain unused depending on the specific layout of a particular space transformer. The substrate of the present embodiment is thick and rigid enough to be self-supporting, while in variations of this embodiment the substrate may be flexible. Since the total thickness of the layers to be deposited is typically only on the order of several hundred microns, the substrate provides the rigidity and robustness required for mounting the final space transformer and microprobe combination onto a PCB. As indicated, the substrate is metallized by deposition of a metal film 110 (e.g., by sputtering). The metal film 110 serves as a seed layer, as an adhesion layer (if necessary), possibly as a barrier layer and/or as a transition layer. In some embodiments the metal film 110 may actually comprise two or more individually applied layers, for example, the film may include an adhesion layer of, e.g., Ti, and a seed layer of, e.g., Au.

In FIG. 13B, a photoresist 112 has been applied and patterned and a first layer of structural material 114 (e.g. Ni) has been pattern-plated. In some alternative embodiments, sacrificial material may be pattern plated and then structural material may be blanket-plated, and then the layer planarized. Electrical contact (i.e. cathodic contact) may be made via the metal film 110.

In FIG. 13C, the resist has been stripped and the exposed portion of metal film 110 etched back. The portion of the film located under the deposited structural material 114 is not removed as it is not readily accessible.

In FIG. 13D, a seed layer of sacrificial material 118 (e.g. Cu) has been deposited by PVD (e.g., sputtering) over a thin deposition of an adhesion layer material 116 (e.g., Ti—W). This seed layer serves as a cathode for subsequent plating and may be used as the contact point for connecting to an electric circuit or alternatively some other conductive element connected to the seed layer may be used as the circuit contact point.

In FIG. 13E, the seed and adhesion layers are shown as having been etched away from an area of an end-point detection region 122 (additional end point detection pads may exist on the substrate but are just not visible from the view provided by FIG. 13E. This removal may, for example, occur by use of a patterned mask that is formed after which etching is allowed to occur, and then the mask removed. This removal of the seed layer prevents metal from being plated up in this region. Of course, in practice the end point detection region 112 will need to be wide enough so that plating of metal occurring via a mushrooming effect from the side walls of structural material 112 which surrounds end-point detection pad 122 will not result in the covering of the pad. In alternative embodiments, at the time of application of seed layer and adhesion layer material the end-point detection region may be shielded so as to not receive the materials.

In FIG. 13F, a sacrificial material 124, e.g. Cu, has been thickly plated (e.g. at greater than a desired layer thickness). In FIG. 13G the build has been planarized, completing the first layer. Building is then allowed to continue so that additional layers are formed so long as both structural and sacrificial materials are conductive there is no need to apply a seed layer during formation of the $2^{nd}$-$N^{th}$ layers. If one of the materials is non-conductive formation of some or all layers may require use of one or more seed layers. In FIG. 13H, all the layers of the space transformer portion of the build have been completed with three-dimensional structural material 114 interconnect being embedded in sacrificial material 124 and laid out in a pattern that connects the relatively coarse-pitch vias to the relatively fine-pitch probes which are still to be fabricated. In alternative embodiments masking could be applied and selective deposition of dielectric made to occur (e.g. a pattern that holds the extended interconnect lines in position).

In FIG. 13I, structural material 114 has been pattern-plated to form what will become fine-pitch vias which will extend through an insulating layer that will next be fabricated. In FIG. 13J, a cap 126 has been applied over the endpoint detection region or area and a high-temperature resistant dielectric material 128 (e.g., polyimide, glass, or the like) has been applied and (if needed) cured.

In FIG. 13K, the cap has been removed and the build has been planarized (and if necessary the opening 132 above the end-point detection pad has been cleaned of debris from the planarization operation. The planarization operation removes the dielectric that lays over the structural material vias of FIG. 13I and leaves in place a dielectric layer that will form a 'roof' for the space transformer portion of the device. In some variations of the embodiment, if the cap is designed to be flush or below flush with the surface of the vias after planarization, it need not be removed at this point. This may be desirable since a cap will be again be used as indicated in FIG. 13M.

In FIG. 13L, a structural material, e.g. Ni, has been pattern-plated (e.g. via a patterned photoresist that is not shown) to form posts that continue the fine-pitch vias and which will serve as the bases for probes structures that will be formed. In variations of this embodiment, the posts may be formed without need for a patterned mask as the only conductive locations on the previous layer are the vias. Formation of posts without a patterned mask may result in widening of the posts, due to mushrooming, and in the posts having non-vertical sidewalls.

In FIG. 13M, another cap 134 has been applied to the endpoint detection area (unless the original cap has been left intact) and a seed layer 136 of sacrificial material, e.g. Cu, and if needed an adhesion layer 138, e.g. of Ti—W, have been deposited by, for example, PVD. In FIG. 13N, a sacrificial material 140, e.g. Cu, has been plated above the seed layer and in FIG. 13O, the build has again been planarized. The build is now ready for the fabrication of the probes.

In FIG. 13P, the probes 142(a)-142(c) have been electrochemically fabricated from a desired material along with an etch-proof shell of structural material 144 that encloses that probes and the sacrificial material 140 that surrounds them. In variations of the present embodiment, instead of forming a roof on the shell of structural material, a coating may simply be applied to prevent etching of the sacrificial material in the probe portion of the structure during an etching operation that removes the other regions of sacrificial material as will be discussed in association with FIG. 13S. In some embodiments, it is desirable not to etch the sacrificial material in the probe region prematurely. Since, for example, once the structure is released it may be too weak to properly support the interconnects during infiltration of a dielectric material (e.g. an epoxy) around the structural material interconnects of the space transformer which have been released from sacrificial material as will be discussed in association with FIG. 13U and since, for example, the presence of the sacrificial material in the probe region may protect the probes from dicing debris that may be generated in a subsequent operation. The electrochemical fabrication of layers of the space transformer and of the probes is completed but the formation process as a whole is not yet completed.

In FIG. 13Q, a photoresist 152 has been patterned on the underside of the substrate 102, electrical (i.e. cathodic) contact has been made to the plated or PVD-deposited material, and solder 154 (e.g., Sn—Pb) has been plated onto the coarse vias (both used and unused, if desired). As shown in FIG. 13R photoresist 152 has been removed and the solder is reflowed to form bumps (if desired). In variations of this embodiment, the solder bumping may be performed at an earlier stage of the process (e.g., after the metallization operation shown in FIG. 13A. In the present process, however, the bumping was not performed earlier, as the lack of the presence of bumps allowed for the bottom of the substrate to remain substantially flat during the EFAB process without need for additional coating and planarization operations and the like. Since the sacrificial material has not yet been etched from the space transformer portion of the build, electrical contact to all coarse vias exists and so bumping of all vias can occur (even to unused vias) if desired.

In FIG. 13S, the exposed sacrificial material has been removed to partially release the structure (with the exception of the sacrificial material that surrounds the probes which is protected by the shell of structural material surrounding it and by the dielectric roof of the space transformer portion of the build. As a result, the removal of the sacrificial material may occur by immersing the entire build into sacrificial material etchant. The release occurs substantially in a lateral manner, with etchant flowing under the roof and around structural material interconnects and structural material pillars 162 that may be used to support the roof of the space transformer (e.g., one in each corner of the device, or spaced out at intervals around the perimeter). It may be necessary, however, to coat the solder bumps with a protective coating if it is attacked by and exposed to the sacrificial material etchant. Following etching of the sacrificial material (and removal of the protective coating from the solder if previously applied), diffusion bonding (e.g., at 250° C.) may be performed to improve the inter-layer adhesion of the device. More teaching concerning the use of diffusion bonding in electrochemical fabrication processes may be found in U.S. patent application Ser. No. 10/841,384 which is filed May 7, 2004 by Cohen et al. which is entitled "Method of Electrochemically Fabricating Multi-layer Structures Having Improved Interlayer Adhesion" and which is hereby incorporated herein by reference as if set forth in full.

In some variations of the present embodiment, reflow of the solder may not have occurred prior to diffusion bonding and the diffusion bonding may serve to reflow the solder. In some embodiments, it may be desirable to perform diffusion bonding after release of the space transformer interconnects from the sacrificial material, particularly when the sacrificial material and the structural material have a significant difference in their coefficients of thermal expansion as may be the case for a nickel structural material and a copper sacrificial material.

In FIG. 13S, a coating 166 has been applied to prevent depositing of space transformer backfill polymer (e.g. a low-viscosity epoxy) onto the bumps. In variations of this embodiment the coating may be applied earlier if it is capable of withstanding the temperatures associated with diffusion bonding. In some variations of the present embodiment, the coating 166 covering the bumps may be eliminated if the backfill polymer is applied in such a way so as to avoid the backfill material contacting the bumps. FIG. 13U shows the state of the process after the back fill material 172 has been infiltrated into the structure and cured to fill the voids in the space transformer. In the present embodiment the epoxy material is allowed to fill all exposed openings. In variations of the embodiment, further restrictions on accessibility of the backfill material to certain regions may be implemented. Since the interconnects are fastened at both ends, it is believed that, with careful backfilling, they will be able to resist deformation and shorting to one another during the filling process. As shown in FIG. 13U, some epoxy has also coated over the top of the device which can be removed by a planarization operation, as shown in FIG. 13V, along with the top of the structural material shell that protected the sacrificial material located in the probe region (as shown in FIG. 13V.

In FIG. 13W, the build has been diced to allow separation of individual package dies. In this embodiment, dicing occurs prior to release of the remaining sacrificial material and thus dicing occurs while the entire structure is either embedded in sacrificial material (probe portion) or epoxy (space transformer portion). After dicing, debris is removed (e.g., by megasonic or ultrasonic cleaning). In variations of the present embodiment, dicing may occur after release of the probes from the sacrificial material. The dicing is performed so that it removes the sidewalls of the Ni shell in the probe region so that the existence of the shell does not limit the accessibility of the probes and a circuit element to be contacted by them when put to use. As shown, the dicing may leave behind a portion of the Ni pillars (in the transformer region), whereas in variations of this embodiment, the pillars may be removed in their entirety or left in their entirety.

FIG. 13X, depicts the state of the process after the bottom-side coating (and any overlying epoxy) have been removed and the remaining sacrificial material removed to release the probes. The probe/space transformer package is now ready to be mounted to a printed circuit board, PCB, (e.g., using surface mount techniques) or to any other desired component. An underfill material may be used to fill any space between the package and the PCB after bonding of the package to the PCB (i.e. via reflow of the solder bumps). It may be desirable to avoid damage to the device, and assuming the PCB can tolerate the sacrificial material etchant, it may be desirable to mount the device to the PCB first, and then perform the final sacrificial material release.

In an alternative embodiment, in lieu of application of a dielectric material 128, as applied in FIG. 13J, a thin metal layer may be used that is capable of being later etched. For example, such etching may occur after the release of the remaining sacrificial material in FIG. 13X to avoid shorting the probes together. Sn, Ni, and Au are examples of metals that may be considered for this use.

FIGS. 14A-14G provide various perspective, side and close up views of an exemplary conceptual space transformer and probe array that may be formed with some embodiments of the invention wherein the space transformer is shown as free standing (i.e. not encapsulated in a dielectric). In some embodiments, the space components of the space transformer may be encapsulated in a dielectric or in a combination of dielectric embedded in a conductive material. The substrate of the space transformer may be bonded to a PCB, interposer, backing board, or the like. Probes may be formed directly on the space transformer interconnects or they may be transferred and bonded to the space transformer singly or in one or more multi-probe arrays. In some embodiments, different substrates may be used, for example, instead of the substrate feeding its vias straight from one surface to an opposing surface they may be fed from one surface to a perpendicular surface (e.g. from a top surface to one or more of the side-walls).

Figure 14A:
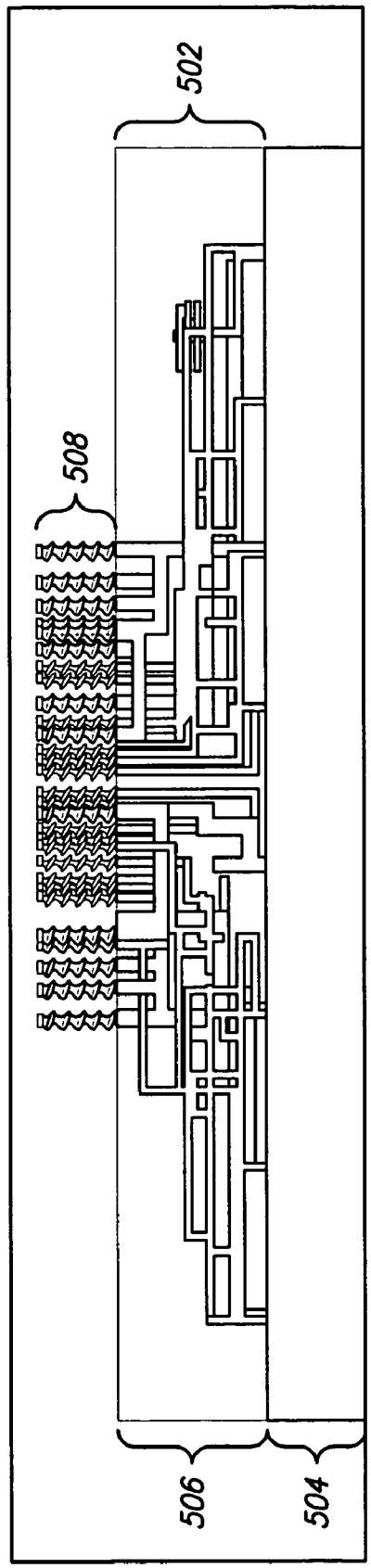
FIGS. 14A-14G provide various perspective, side and close up views of an exemplary space transformer and probe array that may be formed with some embodiments of the invention wherein the space transformer is shown as free standing (i.e. not encapsulated in a dielectric).
Figure 14B:
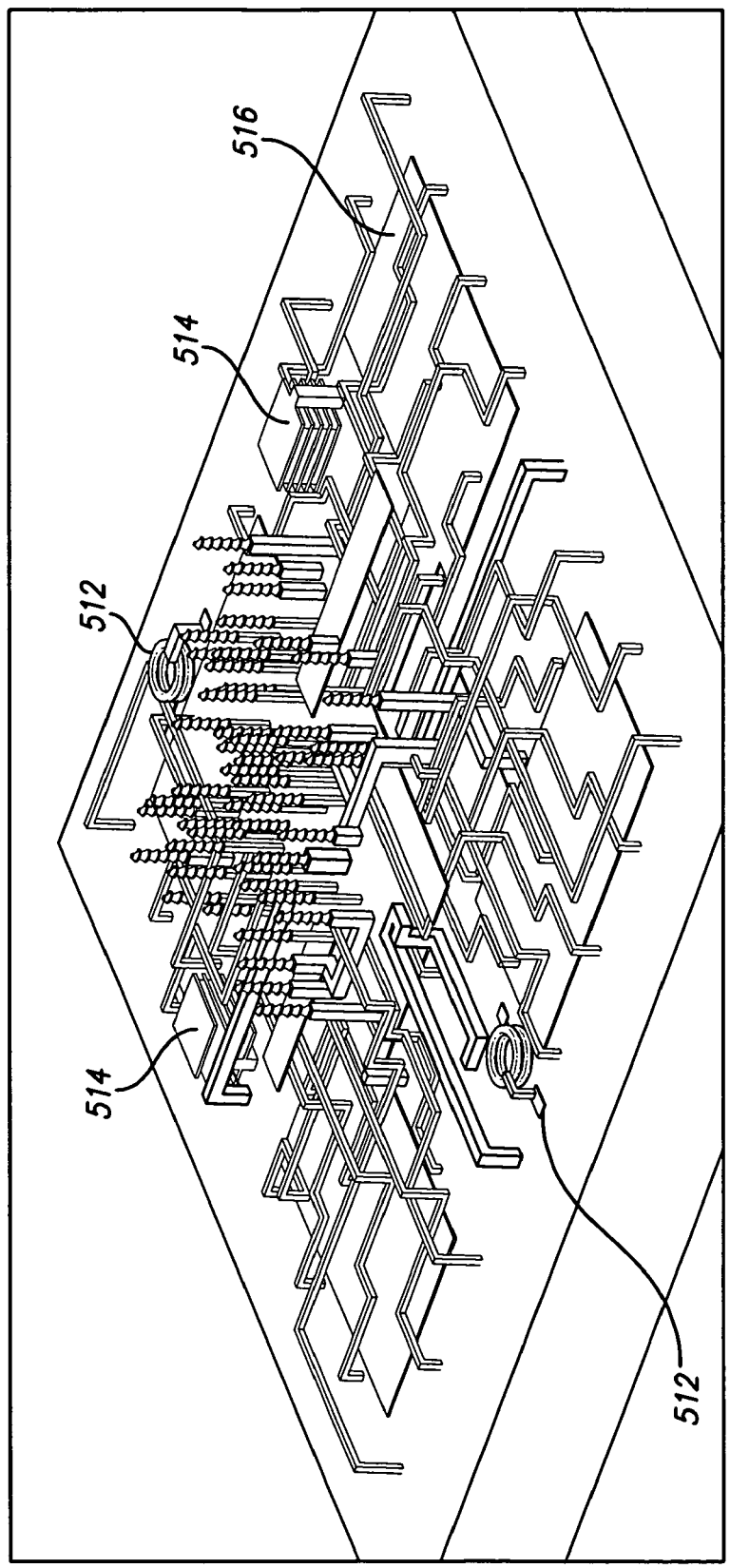
Figure 14C:
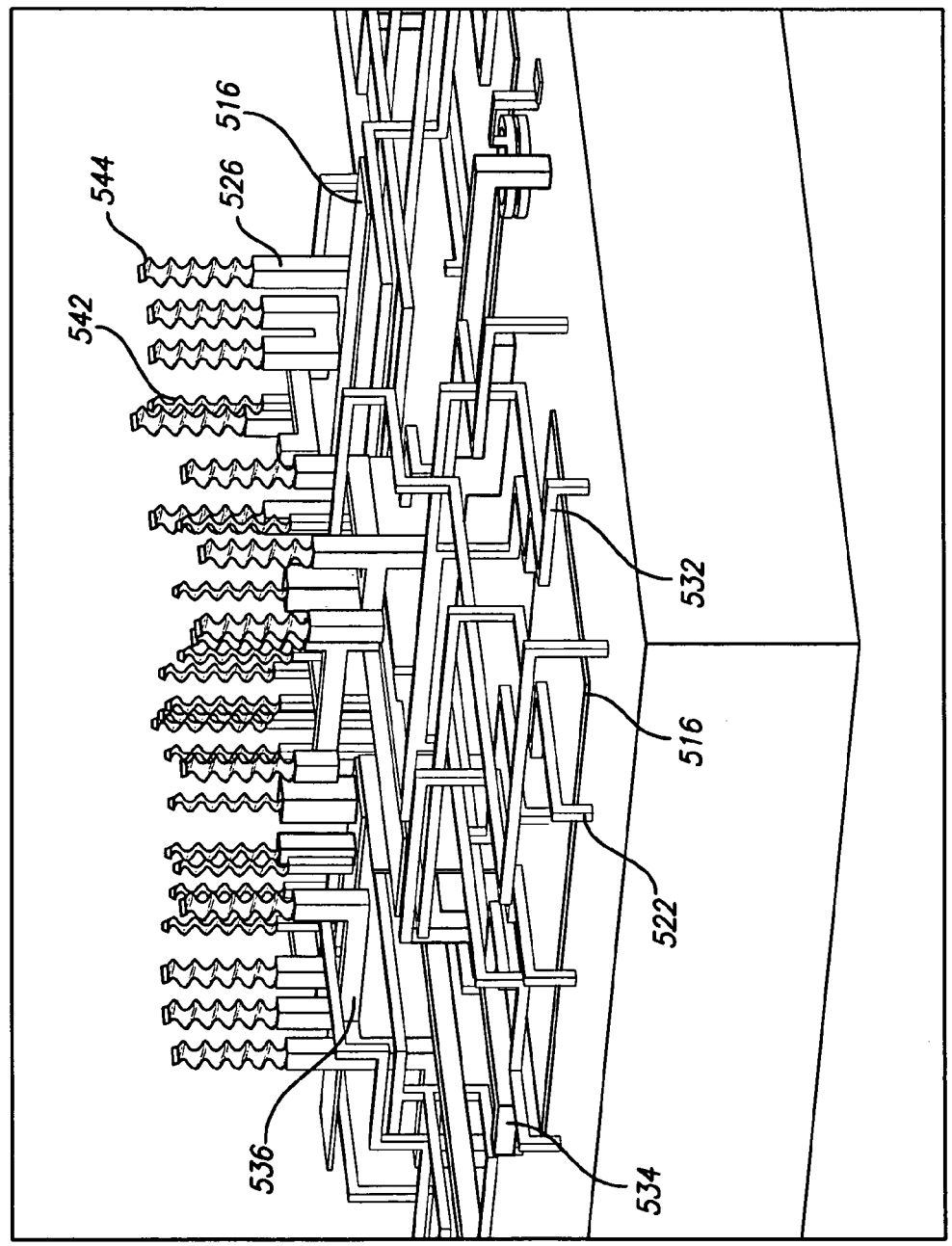
Figure 14D:
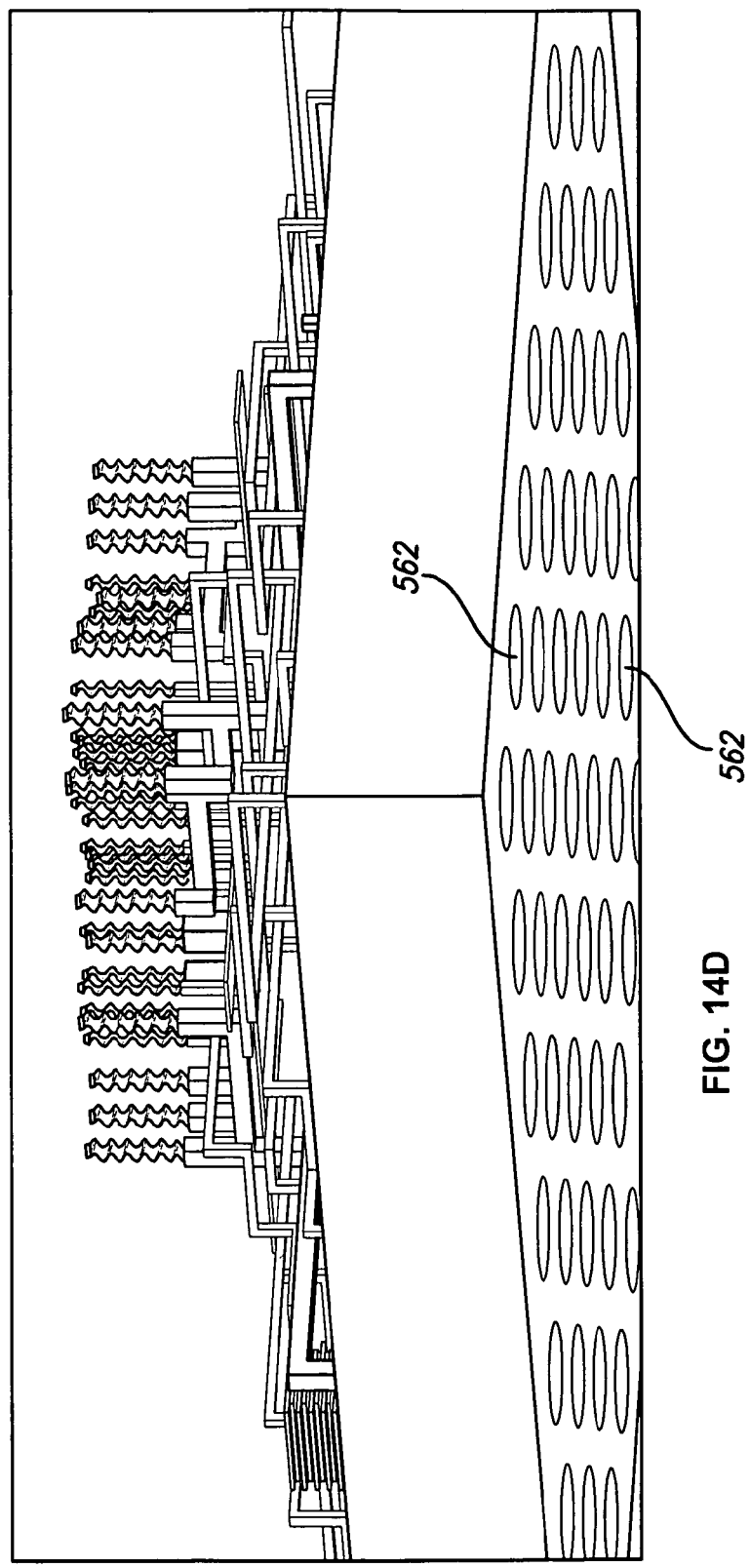
Figure 14E:
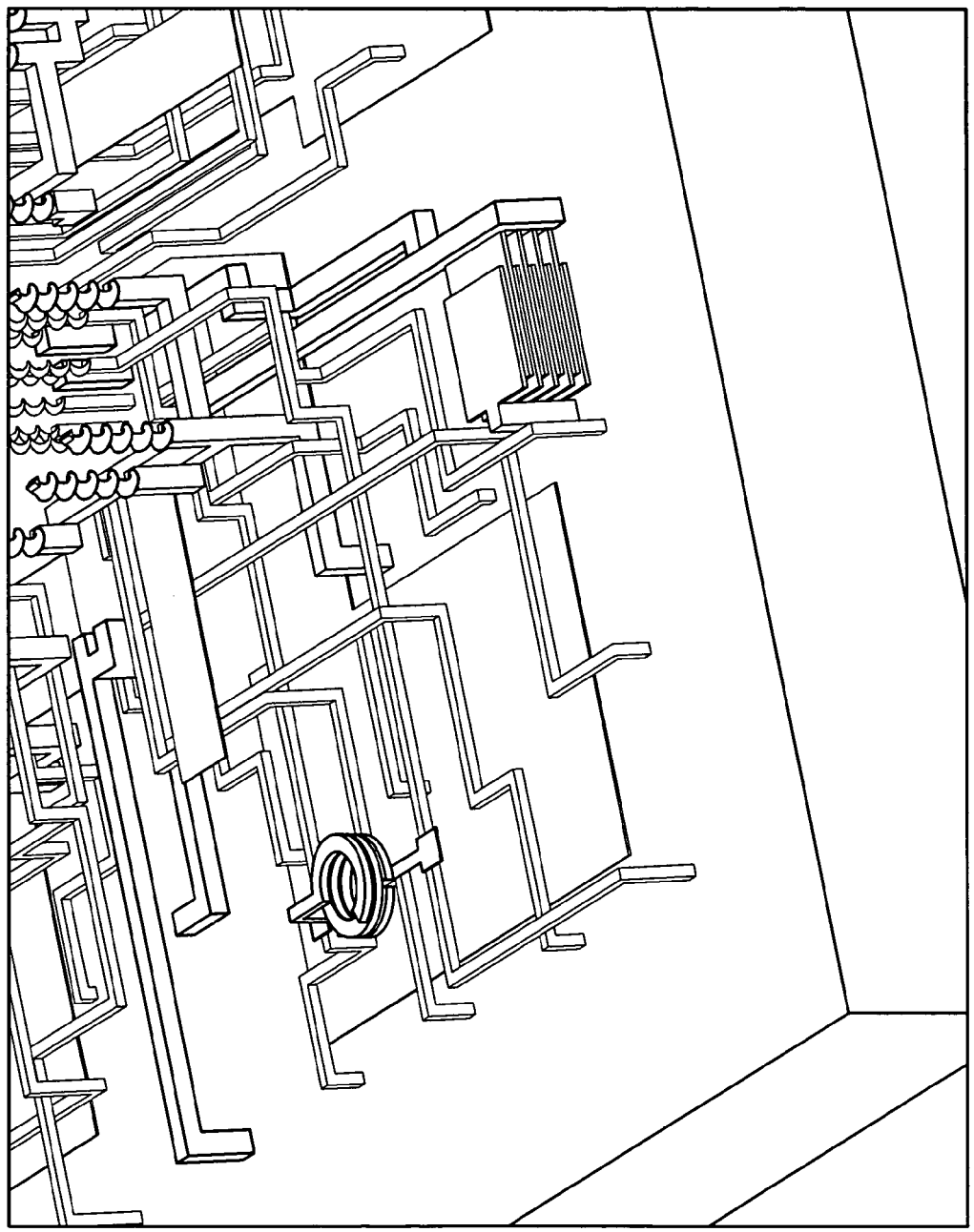
Figure 14F:
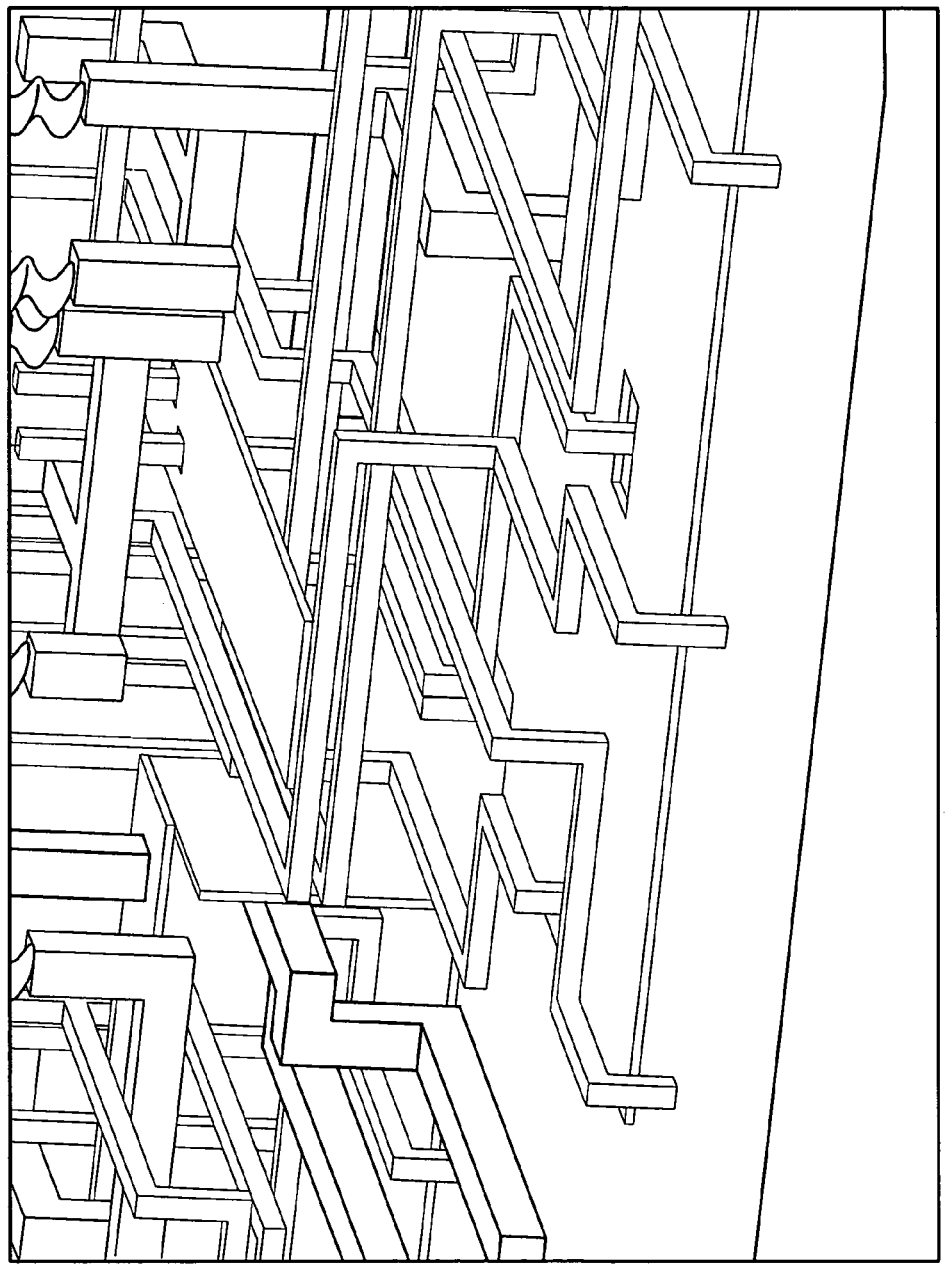
Figure 14G:
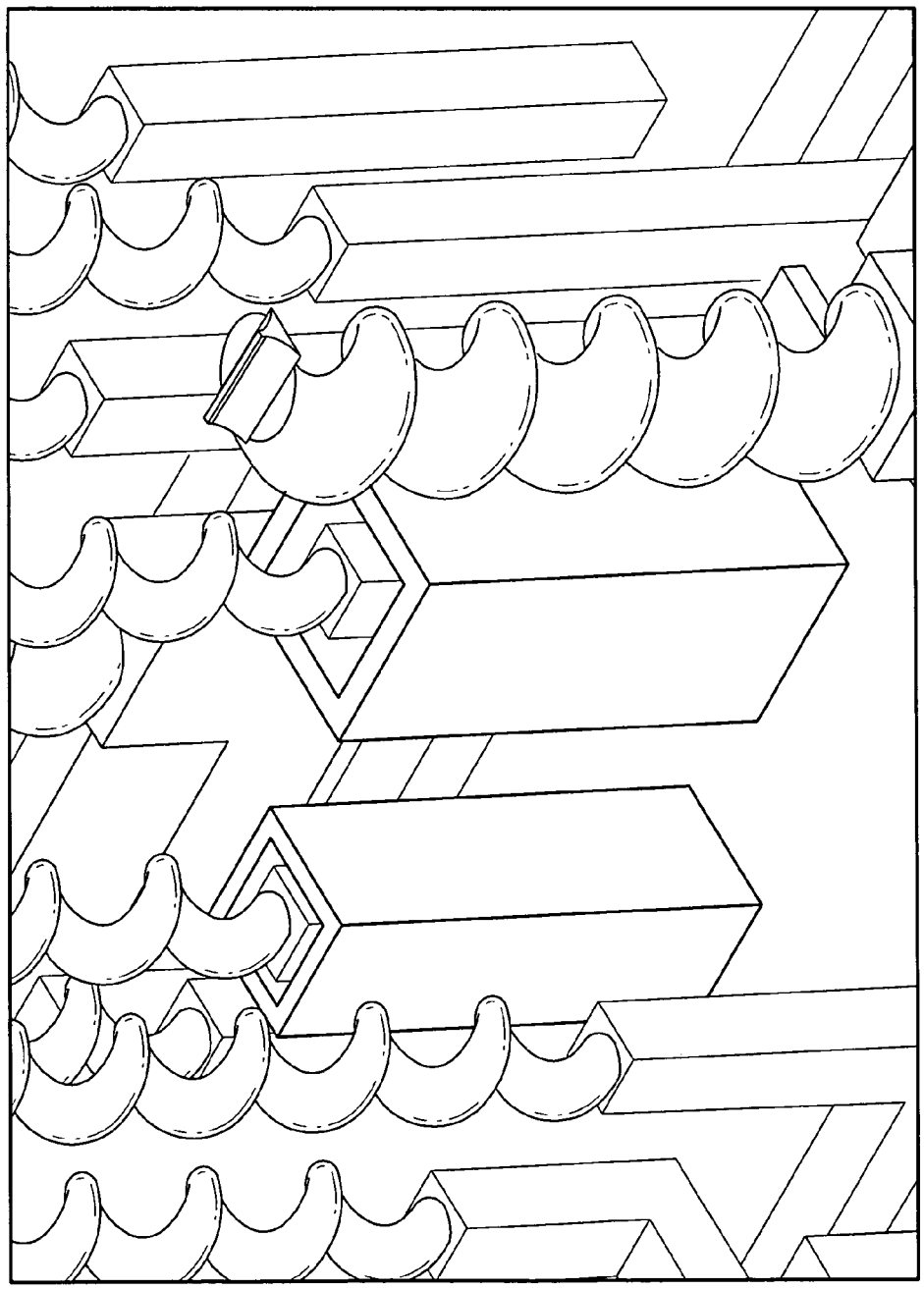

FIG. 14A provide a side view of a sample space transformer 502 having a substrate portion 504, an interconnect and component region 506, and having a probe array 508 attached to its upper surface. To see the various interconnects and components located within the space transform, it is depicted without any encapsulating material. FIG. 14B and 14C provide a distance and close up perspective views of the space transformer and probes. Various components and features of the probes and space transformer can be seen: (1) inductors 512; (2) capacitors 514; (3) ground planes and power planes 516; (4) vias with varying cross-sectional dimensions (i.e. elements that run in essentially a direction perpendicular to the plane of the substrate) 522, 524, and 526; (5) traces with varying widths and heights (elements running in essentially a direction that is parallel to the substrate) 532, 534, and 536; and (6) probes with different diameters and different tips 542 and 544. As can also be seen trace positions and via positions are not limited to separate layers as is typical for commercial space transformers (i.e. horizontal traces and vertical vias may coexist on the same layers). FIG. 14D shows another perspective view of the space transformer which allows a via 562. FIGS. 14E and 14F provide further close up perspective views of probes and space transformer components. FIG. 14G provides a close up view that allows coaxial interconnect structures 572 in the space transformer to be seen.

In some embodiments of the invention, the structural material chosen for use in the space transformer portion of the build need not be the same as that chosen for the probe portion; material used in the space transformer may best be optimized for high conductivity and does not necessarily need to meet stringent mechanical specifications for yield, fatigue, etc. as does the material used for the probes themselves. Thus Au or Cu might be a desirable structural material for the interconnects of the space transformer region while Ni, Ni—Co, or NiP may be more desirable for the probes.

In still embodiments of the invention, the interconnects in the space transformer may be formed not simply as conductive traces but instead as conductive traces with shielding conductors (e.g. like coaxial lines) that may be useful in high frequency applications and the like. Similar shielding may exist around the individual probes (as part of the probe design) and may be separated from the central conducting elements of the probes by continuous or periodic locations of a desired dielectric material. To aid in etching any sacrificial material and/or possible release of a back filling material from between the central interconnect leads and surrounding shield material, the shield material may be perforated with holes that give reasonable access to an etchant.

In various embodiments of the invention, different planarization operations are possible. In some embodiments, e.g. on some layers in a building process, single stage lapping or multi-stage lapping may be used while in other embodiments, chemical mechanical polishing may be used, while in still other embodiments fly cutting, or diamond machining, may be used. Further teachings about planarizing layers and setting layers thicknesses and the like are set forth in the following US Patent Applications which were filed Dec. 31, 2003: (1) U.S. Patent Application No. 60/534,159 by Cohen et al. and which is entitled "Electrochemical Fabrication Methods for Producing Multilayer Structures Including the use of Diamond Machining in the Planarization of Deposits of Material" and (2) U.S. Patent Application No. 60/534,183 by Cohen et al. and which is entitled "Method and Apparatus for Maintaining Parallelism of Layers and/or Achieving Desired Thicknesses of Layers During the Electrochemical Fabrication of Structures". Furthermore, the techniques disclosed explicitly herein may benefit by combining them with the techniques disclosed in U.S. patent application Ser. No. 11/029,220 filed Jan. 3, 2005, by Frodis et al. and entitled "Method and Apparatus for Maintaining Parallelism of Layers and/or Achieving Desired Thicknesses of Layers During the Electrochemical Fabrication of Structures", now U.S. Pat. No. 7,271,888. These patent filings are each hereby incorporated herein by reference as if set forth in full herein.

In some alternative embodiments, the space transformer portion of the package may be formed directly with structural material interconnects and with a dielectric support material instead of with a conductive sacrificial material or in addition to a conductive sacrificial material that may still be located in some areas. Various techniques for combining conductive materials and dielectric materials in electrochemical fabrication process, and possibility into the final structures as formed, are set forth in a number of patent applications: (1) U.S. Patent Application No. 60/534,184, by Cohen, which as filed on Dec. 31, 2003, and which is entitled "Electrochemical Fabrication Methods Incorporating Dielectric Materials and/or Using Dielectric Substrates"; (2) U.S. Patent Application No. 60/533,932, by Cohen, which was filed on Dec. 31, 2003, and which is entitled "Electrochemical Fabrication Methods Using Dielectric Substrates"; (3) U.S. Patent Application No. 60/534,157, by Lockard et al., which was filed on Dec. 31, 2004, and which is entitled "Electrochemical Fabrication Methods Incorporating Dielectric Materials"; (4) U.S. Patent Application No. 60/574,733, by Lockard et al., which was filed on May 26, 2004, and which is entitled "Methods for Electrochemically Fabricating Structures Using Adhered Masks, Incorporating Dielectric Sheets, and/or Seed Layers that are Partially Removed Via Planarization"; and U.S. Patent Application No. 60/533,895, by Lembrikov et al., which was filed on Dec. 31, 2003, and which is entitled "Electrochemical Fabrication Method for Producing Multilayer Three-Dimensional Structures on a Porous Dielectric". The techniques disclosed explicitly herein may benefit by combining them with the techniques disclosed in U.S. patent application Ser. No. 11/029,216 filed Jan. 3, 2005, by Cohen et al. and entitled "Electrochemical Fabrication Methods Incorporating Dielectric Materials and/or Using Dielectric Substrates" and U.S. Patent Application No. 60/641,292 filed Jan. 3, 2005, by Dennis R. Smalley and entitled "Method of Forming Electrically Isolated Structures Using Thin Dielectric Coatings". These patent filings are each hereby incorporated herein by reference as if set forth in full herein.

Further teachings about microprobes and electrochemical fabrication techniques are set forth in a number of US Patent Applications which were filed on Dec. 31, 2003. These filings include: (1) U.S. Patent Application No. 60/533,933, by Arat et al. and which is entitled "Electrochemically Fabricated Microprobes"; (2) U.S. Patent Application No. 60/533,975, by Kim et al. and which is entitled "Microprobe Tips and Methods for Making"; (3) U.S. Patent Application No. 60/533,947, by Kumar et al. and which is entitled "Probe Arrays and Method for Making"; and (4) U.S. Patent Application No. 60/533,948, by Cohen et al. and which is entitled "Electrochemical Fabrication Method for Co-Fabricating Probes and Space Transformers". Furthermore, the techniques disclosed explicitly herein may benefit by combining them with the techniques disclosed in US patent application Ser. No. 11/029,180 filed Jan. 3, 2005, by Chen et al. and entitled "Pin-Type Probes for Contacting Electronic Circuits and Methods for Making Such Probes"; U.S. Patent Application No. 60/641,341 filed Jan. 3, 2005, by Chen et al. and entitled "Vertical Microprobes for Contacting Electronic Components and Method for Making Such Probes"; U.S. patent application Ser. No. 11/029,217 filed Jan. 3, 2005, concurrently herewith by Kim et al. and entitled "Microprobe Tips and Methods For Making"; U.S. patent application Ser. No. 11/028,958 filed Jan. 3, 2005, by Kumar et al. and entitled "Probe Arrays and Methods for Making"; and U.S. patent application Ser. No. 11/029,221 filed Jan. 3, 2005, by Cohen et al. and entitled "Electrochemical Fabrication Process for Forming Multilayer Multimaterial Microprobe Structures", now U.S. Pat. No. 7,531,077. These patent applications are each hereby incorporated herein by reference as if set forth in full herein.

Some embodiments may employ mask based selective etching operations in conjunction with blanket deposition operations. Some embodiments may form structures on a layer-by-layer base but deviate from a strict planar layer on planar layer build up process in favor of a process that interlacing material between the layers. Such alternating build processes are disclosed in U.S. application Ser. No. 10/434,519, filed on May 7, 2003, entitled Methods of and Apparatus for Electrochemically Fabricating Structures Via Interlaced Layers or Via Selective Etching and Filling of Voids which is herein incorporated by reference as if set forth in full.

Some embodiments may not use any blanket deposition process and/or they may not use a planarization process. Some embodiments may involve the selective deposition of a plurality of different materials on a single layer or on different layers. Some embodiments may use selective deposition processes or blanket deposition processes on some layers that are not electrodeposition processes. Some embodiments may use nickel as a structural material while other embodiments may use different materials. Some embodiments may use copper as the structural material with or without a sacrificial material. Some embodiments may remove a sacrificial material while other embodiments may not.

Many other alternative embodiments will be apparent to those of skill in the art upon reviewing the teachings herein. Further embodiments may be formed from a combination of the various teachings explicitly set forth in the body of this application. Even further embodiments may be formed by combining the teachings set forth explicitly herein with teachings set forth in the various applications and patents referenced herein, each of which is incorporated herein by reference.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A fabrication process for co-fabricating a multi-layer probe array and a space transformer, comprising:
   (a) forming and adhering a first layer of material to a substrate, wherein the first layer comprises a desired pattern of at least one material;
   (b) repeating the forming and adhering operation of the steps of (a) a plurality of times to build up the array of probes and the space transformer from a plurality of adhered layers, and wherein at least a portion of the plurality of layers comprises at least one structural material and at least one sacrificial material; and
   (c) after formation of the plurality of layers, subjecting the plurality of adhered layers to a release process that removes at least a portion of the at least one sacrificial material from the plurality of adhered layers,
   wherein the space transformer comprise a plurality of interconnect elements that connect on one side to the array of probes that have a first spacing and connect to pads on another side that have a second spacing that is greater than the first spacing.

2. The process of claim 1 wherein the forming and adhering operation of the steps of (a) comprises an electrochemical deposition process.

3. The method of claim 1 wherein the at least one structural material comprises an electrodeposited metal and the at least one sacrificial material comprises an electrodeposited metal.

4. The method of claim 3 wherein during formation of each of the plurality of layers at least one planarization operation is used to planarize at least the one sacrificial material and the at least one structural material.

* * * * *